(12) United States Patent
Lan

(10) Patent No.: US 10,725,102 B2
(45) Date of Patent: Jul. 28, 2020

(54) ADDRESSABLE TEST CHIP WITH SENSING CIRCUIT

(71) Applicant: Semitronix Corporation, Hangzhou (CN)

(72) Inventor: Fan Lan, Hangzhou (CN)

(73) Assignee: Semitronix Corporation, Hangzhou (CN)

( * ) Notice: Subject to any disclaimer, the term of this patent is extended or adjusted under 35 U.S.C. 154(b) by 0 days.

(21) Appl. No.: 16/377,471

(22) Filed: Apr. 8, 2019

(65) Prior Publication Data

US 2019/0235022 A1    Aug. 1, 2019

Related U.S. Application Data

(63) Continuation of application No. 15/859,306, filed on Dec. 29, 2017, now Pat. No. 10,254,339.

(30) Foreign Application Priority Data

Dec. 30, 2016  (CN) .......................... 2016 1 1260100
Dec. 29, 2018  (CN) ..................... 2018 2 2250453 U
Mar. 22, 2019  (CN) ..................... 2019 2 0376170 U

(51) Int. Cl.
*G01R 31/317*    (2006.01)
*G01R 31/28*     (2006.01)

(52) U.S. Cl.
CPC ... *G01R 31/31722* (2013.01); *G01R 31/2882* (2013.01); *G01R 31/2886* (2013.01)

(58) Field of Classification Search
CPC ............ G01R 31/2882; G01R 31/2886; G01R 31/318597
See application file for complete search history.

(56) References Cited

U.S. PATENT DOCUMENTS

| | | | |
|---|---|---|---|
| 7,342,838 B1* | 3/2008 | Sharpe-Geisler | G06F 13/4243 326/39 |
| 2004/0060272 A1* | 4/2004 | De Mendonca Fava | A01D 46/28 56/10.2 R |
| 2005/0125479 A1* | 6/2005 | Zoso | G06F 7/535 708/620 |
| 2007/0182612 A1* | 8/2007 | Peterson | H03M 1/1071 341/144 |
| 2008/0175080 A1* | 7/2008 | Kim | G01R 31/318511 365/201 |
| 2011/0292708 A1* | 12/2011 | Kang | H01L 24/17 365/63 |

(Continued)

*Primary Examiner* — Alvaro E Fortich
(74) *Attorney, Agent, or Firm* — Syncoda LLC; Feng Ma

(57) ABSTRACT

An address register includes a plurality of edge-triggered flip-flop registers having an input D, an input R, an input CK, and an output Q; a counter logic; a shifter logic; a multiplexer; input ports including a reset signal RST, a clock signal CLK, a shift enable signal SE, a shift data input signal SI; an output port including address signals ADDR. D is coupled to a data output of the multiplexer; R is coupled to a reset (RST) pad; CK is coupled to a clock (CLK) pad; Q is coupled to an address (ADDR) pad; an input of the counter logic is coupled to ADDR; an input of the shifter logic is coupled to ADDR and the shift data input signal SI; an input of the multiplexer is coupled to SE, an output of the counter logic, and an output of the shifter logic.

20 Claims, 17 Drawing Sheets

(56) References Cited

U.S. PATENT DOCUMENTS

2015/0212144 A1* 7/2015 Ouyang .................. H01L 22/14
                                                        324/762.01

* cited by examiner

ADDRESSABLE TEST CHIP WITH SENSING CIRCUIT

CROSS-REFERENCE TO RELATED APPLICATIONS

The present application is a continuation of, and claims priority to, U.S. patent application Ser. No. 15/859,306 filed on Dec. 29, 2017, which claims priority to Chinese Patent Application No. CN 201611260100.3 filed on Dec. 30, 2016. The present application also claims priority to Chinese Patent Application Nos. CN 201822250453.6 filed on Dec. 29, 2018, and CN 201920376170.8 filed on Mar. 22, 2019. The disclosures of these applications are hereby incorporated by reference in their entirety.

BACKGROUND

As the design scale of integrated circuits (IC) continues to expand, the density of electronic devices on a single chip is growing, and the characteristic dimension of electronic devices is diminishing. As known in the art, the IC process flow contains many complex processes, and each process has a specific process deviation, which results in the yield reduction of IC chips. In the background of manufacturability, test chip is used to monitor and improve the yield of IC manufacture effectively, it is very effective to obtain the necessary data of manufacturing process and yield improvement through testing test chip.

Short-ranged test chip and addressable test chip are two types of the test chips frequently used in the manufacture of IC. Short-ranged test chip has been widely used because of its short production cycle, flexible test and high accuracy. However, in the traditional short-ranged test chip, each device under to test (DUT) needs to be connected to two or more pads, therefore, the disadvantage of short-ranged test chip is very obvious: low utilization rate of area. The addressable test chip uses decoders and the switching circuit to achieve the purpose of sharing pads between DUTs, but the type of test chip requires more complicated peripheral circuit. The simplification for the peripheral circuit for the addressable test chip has become the main problem to limit the wide application of the addressable test chip. A technical improvement about this problem has been mentioned in CN patent applications ZL201010612475.8, ZL 201520437526.6 etc.

SUMMARY

The inventors of the present disclosure have recognized that, although the abovementioned technical improvements on the peripheral circuit are successful, the number of DUT is increased greatly in comparison with short-range test chip and addressable test chip with complicated peripheral circuit, which will lead to the test cycle is growth correspondingly, and long periods of testing cannot meet advanced technology nodes' (such as 14 nm, 10 nm, or 7 nm) requirement; on the other hand, the DUT density of existing addressable test chip is less than $1000/mm^2$, the advanced technology nodes needs more high density to improve the failure detection rate and save the cost of manufacturing area.

To solve the technical problem of long test periods of addressable test chips in existing technology, this invention provides a test system that meets the requirements of testing addressable test chip under the advanced technology, which can improve the test efficiency effectively and provide different test modes according to user's needs. Moreover, the invention also discloses a new type of address register; a new type of high density addressable test chip, which can accommodate DUTs more than $1000/mm^2$ and increase the accuracy of measurement.

An addressable test chip test system includes a test equipment, a probe card and an addressable test chip, the test equipment connects to the addressable test chip through the probe card to constitute a test path. An address register is integrated in the probe card or the addressable test chip.

The address register includes a plurality of edge-triggered flip-flop registers, at least one counter logic, at least one shifter logic and a multiplexer; the input ports include a reset signal RST, a clock signal CLK, a shift enable signal SE, a shift data input signal SI, the outputs port is an address signal ADDR. The internal connection of the address register is as follows: the input D of edge-triggered flip-flop registers connected to the data output of the multiplexer, the input R of edge-triggered flip-flop registers connected to RST of address register, the input CK of edge-triggered flip-flop registers connected to CLK of address register, the output Q of edge-triggered flip-flop registers connected to ADDR of address register; the input of the counter logic connected to ADDR of address register; the input of the shifter logic connected to ADDR and SI; the input of the multiplexer connected to SE, the output of the counter logic and the shifter logic. The shift enable signal SE controls multiplexer, the signal chooses one device to work between the counter logic and the shifter logic. When SE=1, the shifter logic is selected, each time the edge of the clock signal is changed, the address signal shifts 1 bit to right, the lowest bit is discarded, the highest bit is changed to SI; any address signal can be inputted from the outside through this mode. When SE=0, the counter logic is selected, if the CLK signal is running, each time the edge of the clock signal is changed, the address signal ADDR can be changed to ADDR+1, the address signal can realize increase in sequence through this mode; if CLK signal is stopped, the address signal ADDR is unchanged, and the address signal can be changed through the above mode of SE=1.

In some embodiments, the address register also includes a scan data output signal (SO) output port, which outputs the lowest bit of the address signal which is used to check whether DUT is the one we want to test.

The addressable test chip is a circuit design technology which combines the addressing circuit with the test chip technology. Common addressable test chip includes a plurality of pads, addressing circuit, switching circuit and DUTs. The addressing circuit connects to address signal pads and obtains address signal through the address signal pads, the addressing circuit also connects to the switching circuit and outputs address select signals to control switches of the switching circuit in on-state or off-state; the switching circuit connects to DUTs and selects a single DUT to be tested through the switch state; the addressing circuit also connects to the power pads and the power pads supply power for the whole test chip, the switching circuit also connects to test pads and the test pads supply test points for the whole test chip.

For common addressable test chip, the addressing circuit includes a set of rows and columns addressing circuit; the switching circuit includes a set of rows and columns switching circuit. Various embodiments of the present disclosure also provide a new type of addressable test chip, which can be configured with at least one addressing circuit and at least two switching circuits; a forcing circuit can be provided including an addressing circuit and a switching circuit; a sensing circuit can be provided including an addressing circuit and a switching circuit; a DUT array can be configured with a pair of forcing circuit and sensing circuit; the pair of forcing circuit and sensing circuit can share one common addressing circuit, or each can have its own addressing circuit.

The new type of addressable test chip includes a plurality of pads, at least one forcing circuit, at least one sensing circuit and DUTs. The DUTs can be divided to one or more DUT arrays, a pair of forcing circuit and sensing circuit can be configured to each DUT array; each forcing circuit includes a force addressing circuit and a force switching circuit, each sensing circuit includes a sense addressing circuit and a sense switching circuit; for each DUT array, the force addressing circuit and sense addressing circuit connect to address signal pads and obtain address signal through the address signal pads, and also connect to the force switching circuit and sense switching circuit respectively, and output address select signals to control switches of the force switching circuit and sense switching circuit in on-state or off-state; the force addressing circuit and the sense addressing circuit is the same addressing circuit when the forcing circuit and the sensing circuit share one addressing circuit; the force and sense switching circuits connect to DUTs and select the same DUT to be tested through the state of switches. The force addressing circuit and sense addressing circuit also connect to the power pads and the power pads supply power for the whole test chip, the force and sense switching circuits also connect to test pads and the test pads supply test points for the whole test chip.

The test equipment includes a function generator, a switch matrix module, several source measurement units (SMUs) and at least one database; at least one SMU is configured to provide power supply for the test object (chip to be tested); at least one SMU is used to connect to the switch matrix module; at least one SMU is used to connect to the address register; some SMUs are test SMUs, these test SMUs connect to the ports of DUTs to realize electrical test, and these test SMUs are also connected to the function generator; the database is used to store test results.

In some embodiments, all the SMUs in test equipment are connected to the probe card through the switch matrix module.

The addressable test chip test system of the invention includes the aforementioned test equipment, a probe card and an addressable test chip, and the aforementioned new type of address register is integrated in the probe card or the addressable test chip.

The structure of the test system is as follows: the address registers connected to the addressing circuits in the addressable test chips; at least one SMU in the test equipment connects to the power pads in the addressable test chip through the probe card, and provides power to the test chip in the test equipment; at least one SMU connected to the switch matrix module, and the switch matrix module connected to the address register; the function generator and at least one SMU are respectively connected to the address register; at least two SMUs are test SMUs, and the test SMUs connected to the switching circuit of the test chip through the probe card, so as to provide voltage and realize data test; the function generator also connected to these test SMUs.

In some embodiments, the buffers are configured to the address circuit to solve the problem of too long metal wiring connection and signal integrity.

In some embodiments, a buffer is configured in the test equipment or the probe card of the test system, and the function generator doesn't connect directly with the test SMUs, but is connected to the test SMUs through the buffer.

In some embodiments, more SMUs are configured to keep the test system more stable, two or more SMUs are required to supply power; sometimes, when the parallel testing is needed, several DUTs need to be test simultaneously, one test results output terminal needs to be configured as one SMU.

Before the test system is tested, the test equipment is configured to connect with the probe card; in response to the test requirement, the test equipment controls the probe card to connect with the addressable test chip; the function generator generates clock pulse signals, the clock pulse signal stimulates the address register to generate address signals, the address signal is decoded to address select signals through addressing circuit in the addressable test chip, the address select signal controls switching circuit to select a DUT to be tested, at the same time, the clock pulse signal generated by the function generator is output into the test SMUs in the test equipment to trigger the test equipment to enter test state; therefore, the test equipment will test the selected DUT immediately when the DUT is selected.

Based on the function of the address register, when the shift enable signal SE=1, the shifter logic in the address register is selected, and the address register has the same function of a shift register, the test chip entries the address configuration mode: each time the edge of the clock signal is changed, the address register 1) shifts all address bits right 1 bit, 2) reads the shift data input SI into the highest address bit, and 3) the lowest address bit is discarded. After all address bits have been shifted in, the address register is configured to the desired address. When the shift enable signal SE=0, the counter logic in the address register is selected, and the address register has the same function of a counter, the test chip entries either the sequential test mode if the clock signal is running, or the diagnostic test mode if the clock signal is stopped. In the sequential test mode, each time the edge of the clock signal is changed, the address is transformed to the next address (address+1), and the corresponding DUT is tested by the test equipment; as the clock pulse keeps running, all DUTs will be successively tested by the test equipment. In the diagnostic test mode, the clock signal is stopped, thus the selected DUT will not be changed, the selected DUT can be diagnosed by adjusting the voltages of its terminals, e. g. plot the Id-Vg curve of a transistor DUT, by changing the voltage on gate terminal; if the other DUTs need to be tested, reconfigured the address to select a DUT to test every time.

The addressable test chip test system according to some embodiments executes address configuration mode as follows:

A1, power on the test system;
A2, configure the SMUs and the function generator;
A3, set the reset signal RST=1 and maintain more than 100 μs, then turn the reset signal RST=0;
A4, set the shift enable signal SE=1, the test chip entries the address configuration mode;
A5, the variable i is assigned to the address data bit N, the shift data input signal SI is assigned to the i-th of the address data bit;
A6, maintain more than 10 us;
A7, the function generator produces a complete pulse;
A8, the variable i is assigned to i−1; if i=0, end the address configuration, otherwise, go back to step A5;

After the address configuration is completed, take DUTs are transistors as an example, the addressable test chip test system executes sequential test mode as follows:

B1, configure the SMUs and the function generator;

B2, set the address range of the DUTs from StartAddr to EndAddr, the number of the DUT is N, M measurement items need to be tested for each DUT, and each measurement items corresponds to a different voltage/current combination of the signal line ports connected to DUTs (in some embodiments, a transistor connected to signal line GF, GL, DF, DL, SF, SL, BF);

B3, each measurement items of the M measurement items is labeled as Mi (i is an integer from 1 to M), execute steps from B5 to B11;

B4 set the address data as StarAddr;

B5, execute steps from A4 to A8, complete the address configuration for sequential test mode;

B6, set SE=0;

B7, set the function generator to produce a continuous pulse (square wave), and set a needed frequency and set the number of pulses as N;

B8, start function generator, during each pulse time, the addressable test chip completes an address transformation, the test SMU will complete a test, and the test results are stored into test SMUs momentarily;

B9, every SamplePerFetch pulse, reads the test results from test SMU, fetches and stores the data into the database.

B10, finish the test until all the N pulses are generated, and all the test results are stored in the database.

Wherein, StartADDR, EndADDR and SamplePerFetch are integers, and EndADD≥StartADDR; in some embodiments the DUT comprises a MOS transistor, GF, GL, DF, DL, SF, SL, BF are signal lines connected to the ports of DUT, and GF, GL, DF, DL, SF, SL, BF pads are test pads. GF and GL pads are pads connected to the gate end of DUT, DF and DL pads are pads connected to the drain end of DUT, SF and SL are pads connected to the source end of DUT, and BF pad is a pad connected to the substrate end of DUT.

After the address configuration is complete, the addressable test chip test system executes diagnostic test mode as follows:

C1, configure the SMUs and the function generator;

C2, set the address, named Addr, of the DUT to be diagnosed;

C3, set the address data as Addr;

C4, execute steps from A4 to A8, complete the address configuration;

C5, set SE=0;

C6, adjust the voltages/current on test pads, and measure accordingly for diagnosis;

C7, go back to step C3 if another DUT needs to be diagnosed.

In some embodiments, the address register is integrated in a common addressable test chip, which constitutes a new type of addressable test chip. The input end of the address register connected to address register pads in the test chip; the output end of the addressing circuit connected to the first port of the switching circuit, the second and third port of the switching circuit connected to DUTs and test pads through signal lines. The address register outputs address signals, these address signals are decoded by the addressing circuit as address select signals, these address select signals control switching circuit to select DUT to be test. Compared with the common addressable test chip, the inputs end of addressing circuit are connected to the address pads; if the number of DUT is N, this means that N address select signals are required; according to the principle of digital circuit, $\log_2 N$ address signals are required to generate N address select signals, therefore, $\log_2 N$ address signal pads are also required. As the development of the IC in high integration degree and high manufacturing area utilization ratio, more higher density DUTs are fabricated in one test chip, but more DUTs means more address signal pads, the area of a pad is much bigger that a DUT in test chip, more address signal pads must limit the number of DUT. Integrating a new type of address register provided by the invention into the common addressable test chip only requires at least four address register pads (SE, SI, RST, CLK) to replace the $\log_2 N$ address signal pads, this method greatly reduces the area of the pad in the addressable test chip and expands the capacity of the DUT. In some embodiments, $10^6$ DUTs can be accommodated in 10 $mm^2$ area.

The addressable test chip test system according to some embodiments includes a test equipment, a probe card, and an addressable test chip integrated with the new type of address register: at least one source measurement unit (SMU) connected to the power pads VDD and VSS through the probe card, to provide power for the test chip; at least one SMU connected to the switch matrix module, and the switch matrix module connected to the input pads SE and SI of the address register through the probe card; at least one SMU connected to the RST pad of the address register in the test chip through the probe card; the function generator connected to the pad CLK of the multipurpose register through the probe card; at least two SMUs are test SMUs, and these test SMUs connected to the test pads (which are connected to DUTs' ports through switch circuit) in the addressable test chip through the probe card, so as to provide voltage and realize data test for the test chip; the function generator also connected to the test SMU; the database in the test equipment is used to store the test results.

In some embodiments, the address register is integrated in the probe card, and the addressable test chip test system includes a test equipment, an addressable test chip and a probe card integrated with the new type of address register: at least one SMU connected to the power pads VDD and VSS through the probe card, to provide power for the addressable test chip; at least one SMU connected to the switch matrix module, and the switch matrix module connected to the input pads SE and SI of the address register in the probe card; the output of the address signal from the address register connected to the address signal pads of the addressable test chip; at least one SMU connected to the address register through the reset signal RST; the function generator connected to the address register through the clock signal CLK; at least two SMU are test SMUs, and these test SMUs connected to the test pads (these test pads are connected to DUTs' ports by switch circuit) of the test chip through the probe card; the function generator also connected to the test SMU; the database in the test equipment is used to store the test results.

The address register integrated into addressable test chips or integrated into the probe card has its advantages and disadvantages. (1) As mentioned before, integrating the address register into addressable test chip, only several address register pads can be used instead many address pads in the common addressable test chip, which can greatly reduce the occupied area of the pad in the addressable test chip, high-density test chips with device density >1000/$mm^2$ can be designed and fabricated, but the performance of address register will be affected by IC manufacturing process because of the address register is fabricated with test chip through the IC manufacturing process. (2) Integrating the address register into a probe card and using a addressable test chip without the address register in the test system, although the DUT density of common addressable test chip less than 1000/$mm^2$, this method is very convenient because the simple design and mature manufacturing process of probe card, the performance of the address register is stable, and the probe card can be reused to realize the recycling of resources.

Comparing with common addressable test chip test system, the addressable test chip test system disclosed in the invention: (1) the test system provides with two test modes result of including a new type of address register, user can select the diagnostic test mode and the sequential test mode according to the requirement; especially for sequential test mode, the function generator and the address register work together to generate continuous address signals can test all DUTs continuously and quickly, this test mode does not need user write test plan, and does not need the test equipment to configure an address for each DUT every time, it can improve the test efficiency effectively; (2) the test system provides a quickly tested method: the function generator generates clock pulse signals to stimulate the address register to select one or more DUTs to be tested, at the same time, the clock pulse signal is output into the test SMUs in the test equipment to trigger the test equipment to enter test state; therefore, the test equipment will test the selected DUT immediately when the DUT is selected to improve the test speed significantly; (3) when the new type of address register is integrated into common addressable test chip, the new type addressable test chip has high density DUTs and the number of DUT can reach to >1000/mm$^2$; (4) All DUTs are connected to four ends through signal lines to improve the test accuracy; (5) the test system provides a new type of addressable test chip configured with sensing circuit, forcing low current into sensing circuit can sense the voltage at two terminals of the selected DUT, and the sensed voltage is very close to the voltage of the DUT, therefore, more accurate resistance can be obtained. In some embodiments, the address register can be omitted.

DETAILED DESCRIPTION

With the shrinking of integrated circuit (IC) manufacture process, the number of transistors in single chip is increasing, the yield of advanced IC technology is also facing many challenges. In the background of manufacturability, test chip is used to monitor and improve the yield of IC manufacture effectively. Traditional short-range test chip, each port of the being tested DUT (device under be tested) individually connect to the probe pin (PAD). PADs occupy large area in wafer, therefore, the number of PAD is limited, resulting in the number of devices under to test (DUTs) can be measured is limited, and low rate area utilization of test chip. So that test chips designed by this method are unable to meet the needs of device statistical modeling.

Figure 5A:
FIG. 5A illustrates a type of addressable test chip without address register.

Addressing circuit can be used to test numerous devices because of the advantage of sharing PADs in testing, engineers integrated it into test chip design to test more devices. As shown in FIG. 5A, ordinary addressable test chip includes a plurality of PADs (labeled as "P," "A," "T" in figure), addressing circuit, switching circuit and DUTs. The addressing circuit connects to address signal pads (labeled as "A" in figure) and obtains address signal through the address signal pads, the addressing circuit also connects to switching circuit and outputs address select signals to control switches of the switching circuit in on-state or off-state; the switching circuit connects to DUTs and selects a single DUT to be tested through the switch state; the addressing circuit also connects to power pads (labeled as "P" in figure) and the power pads supply power for the whole test chip, the switching circuit also connects to test pads (labeled as "T" in figure) and the test pads supply test points for the whole test chip.

The present invention will be further described in conjunction with the drawings and specific embodiments, but the scope of protection of the present invention is not limited thereto.

Example 1

An addressable test chip test system includes a test equipment, a probe card and an addressable test chip, the test equipment connects to the addressable test chip through the probe card to constitute a test path, the above addressable test chip is an addressable test chip configured with an address register.

Figure 1:
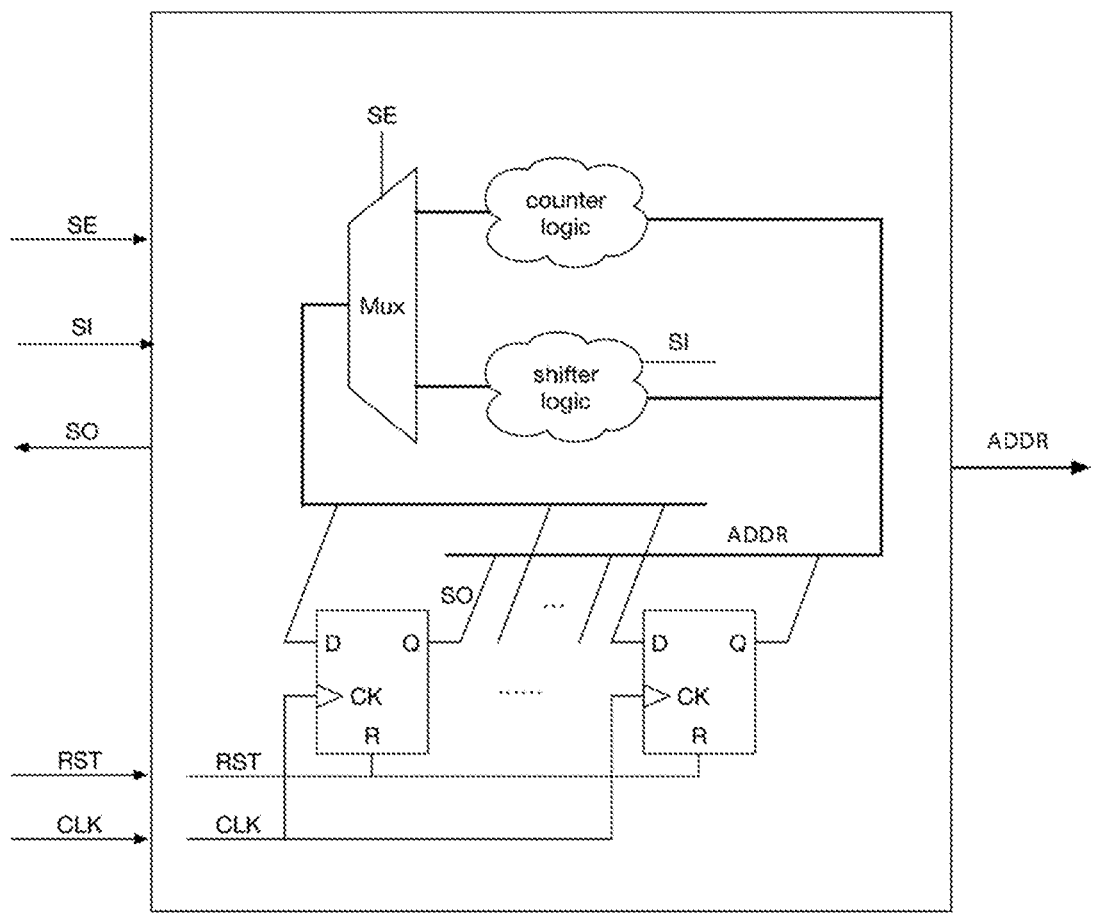
FIG. 1 illustrates a circuit structure of the address register according to some embodiments.

The address register can implement the function as a counter or a shifter through changing its external signal. As shown in FIG. 1, the address register includes a plurality of edge-triggered flip-flop registers, a counter logic, a shifter logic and a multiplexer; the input ports include a reset signal RST, a clock signal CLK, a shift enable signal SE, a shift data input signal SI, the output ports include a scan data output signal SO and several address signals ADDR. The internal connection of the address register can be as follows: the input D of edge-triggered flip-flop registers connected to the data output of the multiplexer, the input R of edge-triggered flip-flop registers s connected to RST of address register, the input CK of edge-triggered flip-flop registers connected to CLK of address register, the output Q of edge-triggered flip-flop registers connected to ADDR of address register, the input of the counter logic is connected to ADDR of address register, the input of the shifter logic connected to ADDR and SI; the input of the multiplexer connected to SE, the output of the counter logic and the shifter logic. The shift enable signal SE controls multiplexer, the signal chooses one device to work between the counter logic and the shifter logic. When SE=1, the shifter logic is selected, each time the edge of the clock signal is changed, the address signal shifts 1 bit to right, the lowest bit is discarded, the highest bit is changed to SI; any address signal can be inputted from the outside through this mode. When SE=0, the counter logic is selected, if the signal clock signal (CLK) is running, each time the edge of the clock signal is changed, the address signal ADDR can be changed to ADDR+1, the address signal can realize increase in sequence through this mode; if clock signal is stopped, the address signal ADDR is unchanged, and the address signal can be changed through the above mode of SE=1.

Figure 2:
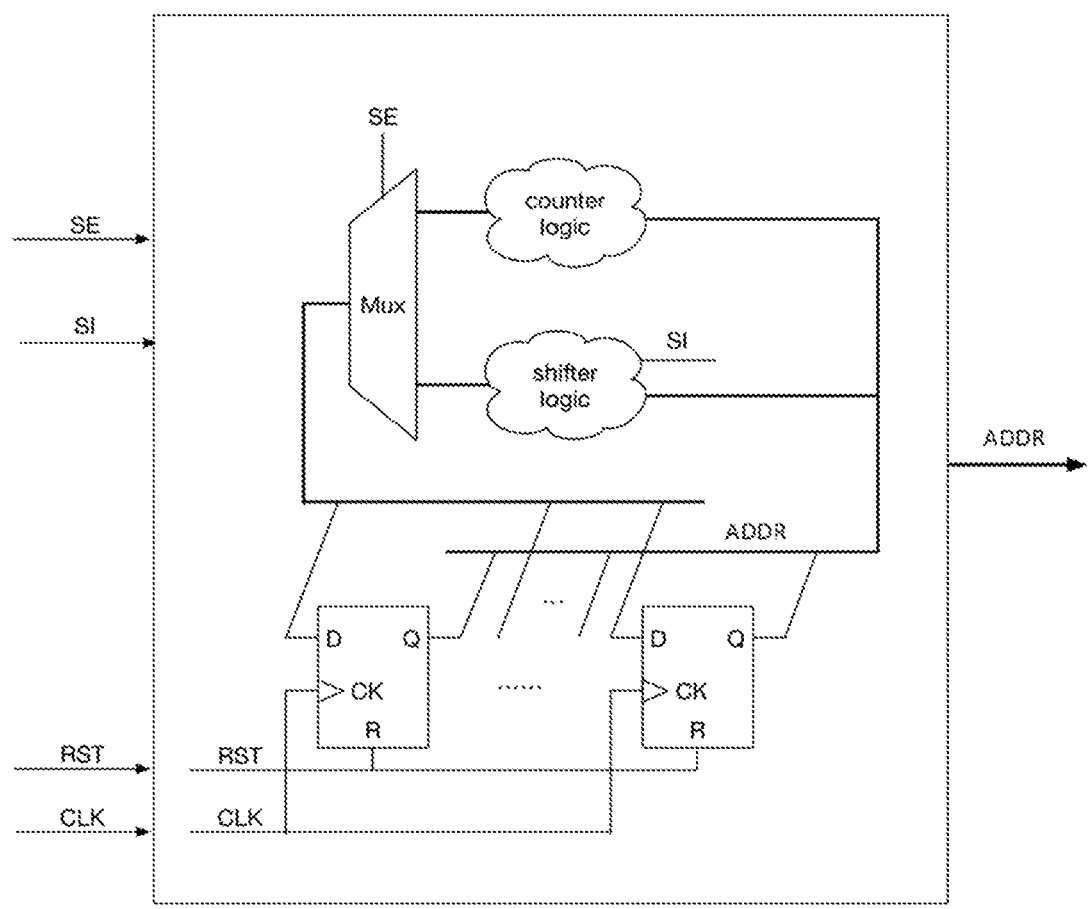
FIG. 2 illustrates another circuit structure of the address register according to some embodiments.

The scan data output signal (SO) is configure to check whether DUT is the one we want to test when the address register is integrated into the addressable test chip test system, in some embodiments, the SO output port can be omitted, as shown in FIG. 2.

In some embodiments, the address register can be configured with two or more counter logics and two or more shifter logics, in case of one counter logic or shifter logic does not work to affect the whole chip.

Figure 3A:
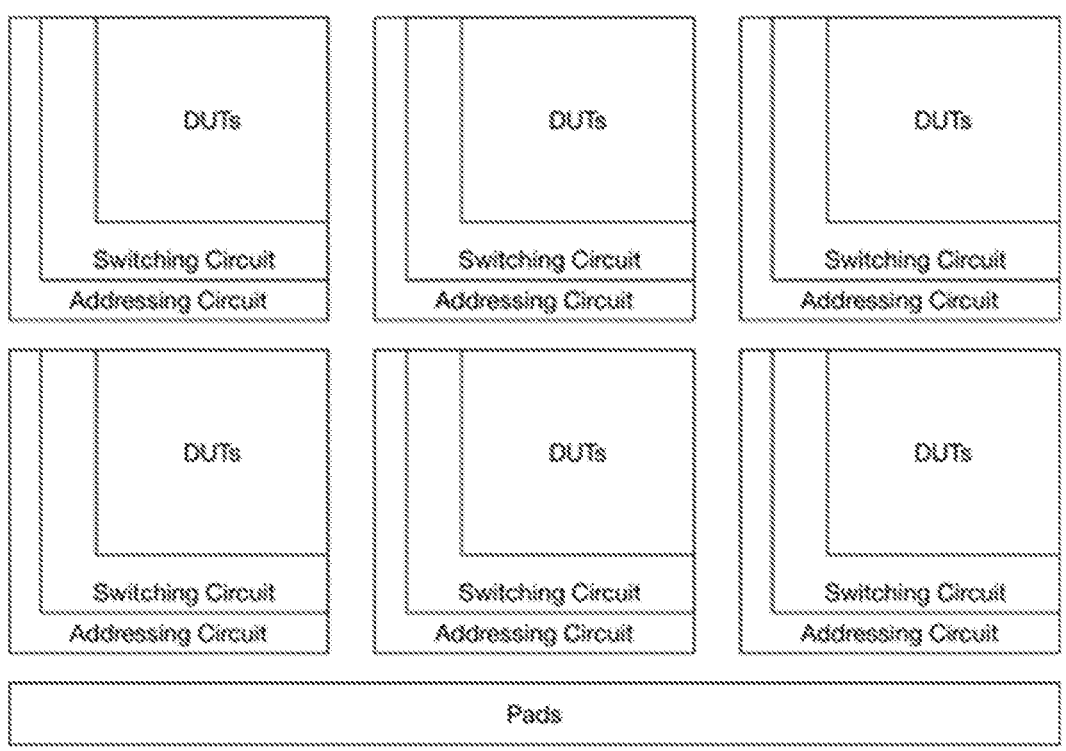
FIG. 3A illustrates a type of addressable test chip without address register.
Figure 4A:
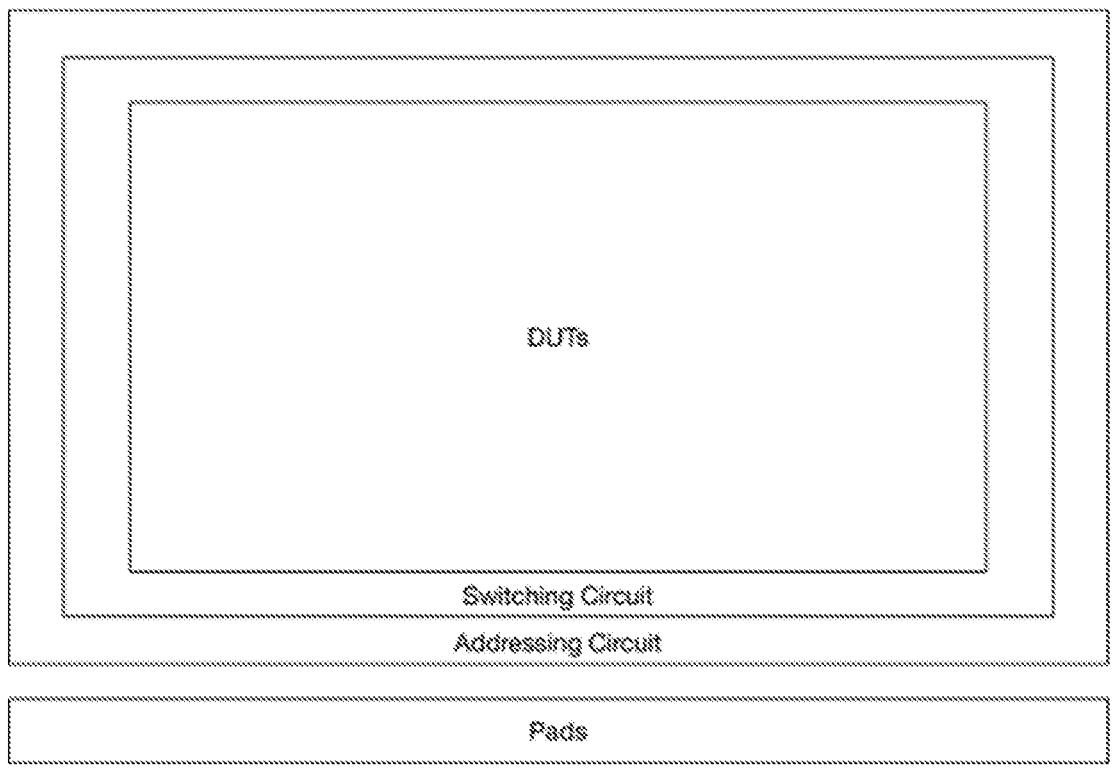
FIG. 4A illustrates a type of addressable test chip without address register.

For an addressable test chip, there are three most common layout structures, as shown in FIG. 3A, FIG. 4A, FIG. 5A. All the DUTs in FIG. 3A are divided into a plurality of DUT arrays, each array configured with a set of switching circuit and addressing circuit; the type of test chip is suitable for numerous DUTs and precision requirements is not very high. In FIG. 4A, all DUTs of the addressable test chip share a set of switching circuits and addressing circuits; this type test chip is suitable for numerous DUTs and precision requirements is not very high, unlike the type test chip shown in FIG. 3A, this type test chip can be applied into the actual product layout, and the key components can be tested without modifying the actual product layout. As shown in FIG. 4A, the "switching circuit" is labeled as "S," the "addressing circuit" is labeled as "A," the "Address Register" is labeled as "R"; all DUTs are divided into a plurality of DUT blocks, and all blocks are similar to "series" arrangement, the number of DUT in each block is small; moreover, each block is configured with a set of switching circuit and an addressing circuit; this type of test chip is suitable for small number of DUTs, it occupies small area and can be placed in the scribe line of wafer.

Figure 3B:
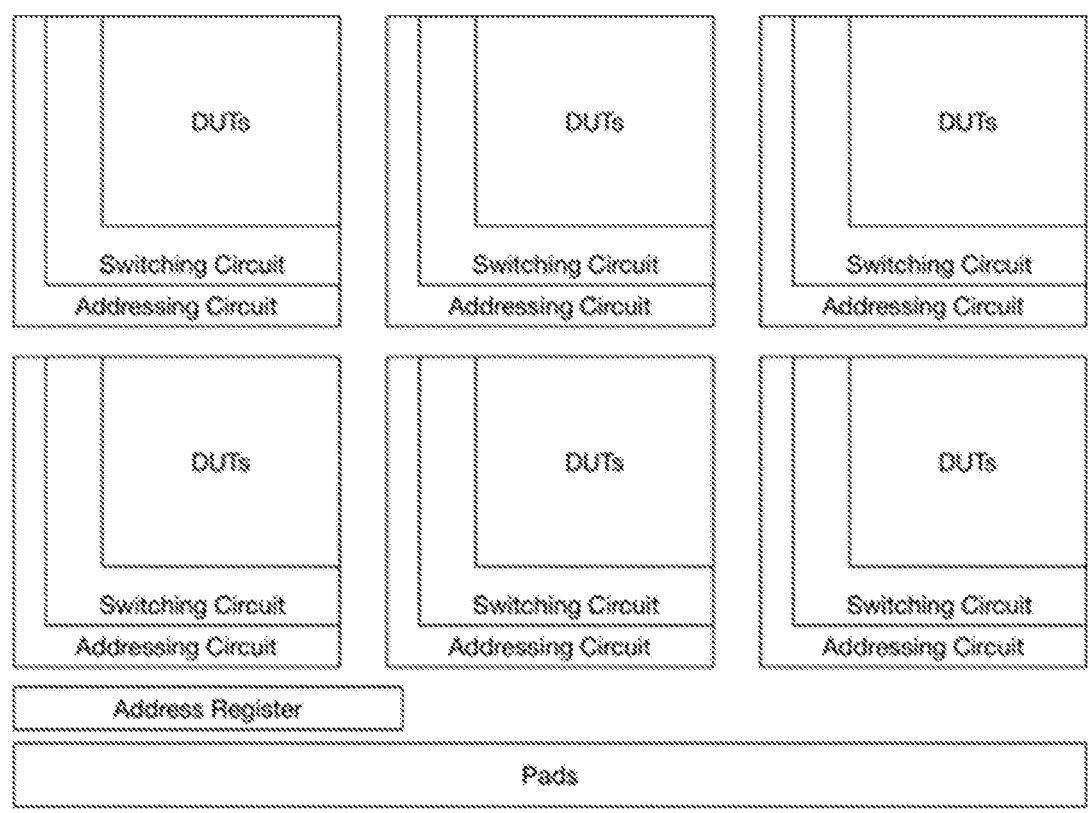
FIG. 3B illustrates a type of addressable test chip integrated with address register.
Figure 4B:
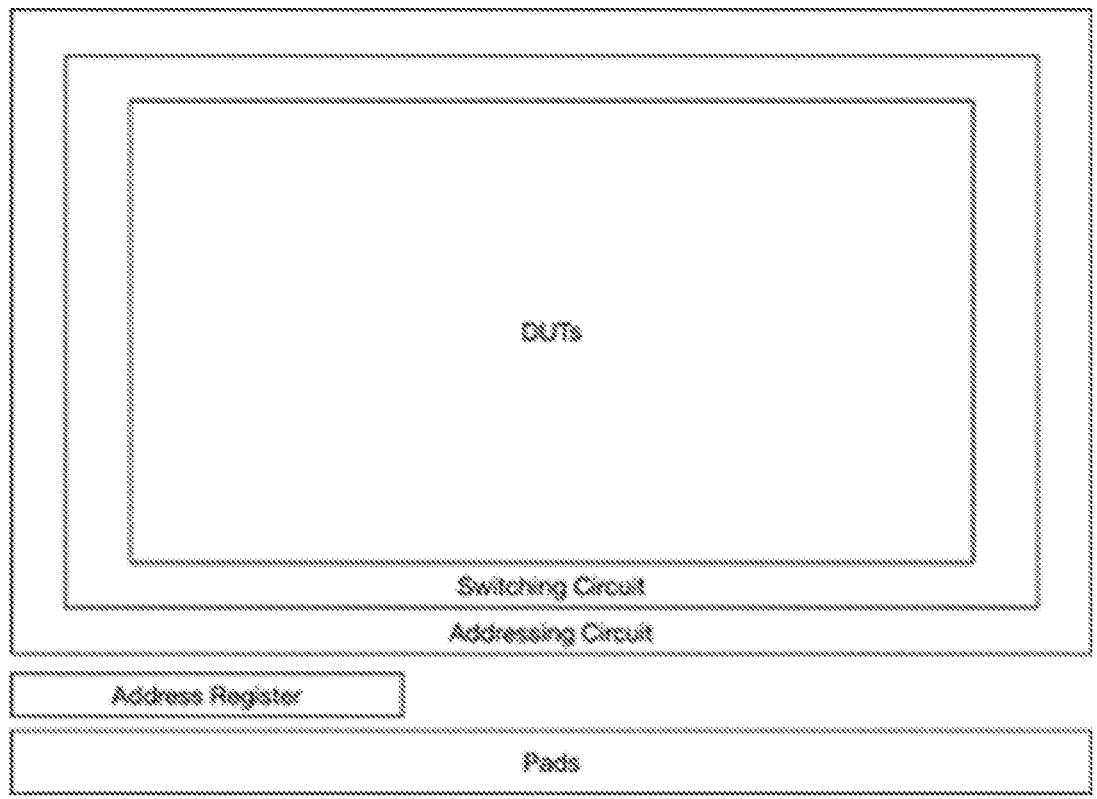
FIG. 4B illustrates a type of addressable test chip integrated with address register.
Figure 5B:
FIG. 5B illustrates a type of addressable test chip integrated with address register.

In the embodiment, the address register is configured into common addressable test chip. FIG. 3B, FIG. 4B, and FIG. 5B are layout structures of three types of addressable test chips configured with address registers.

Figure 6A:
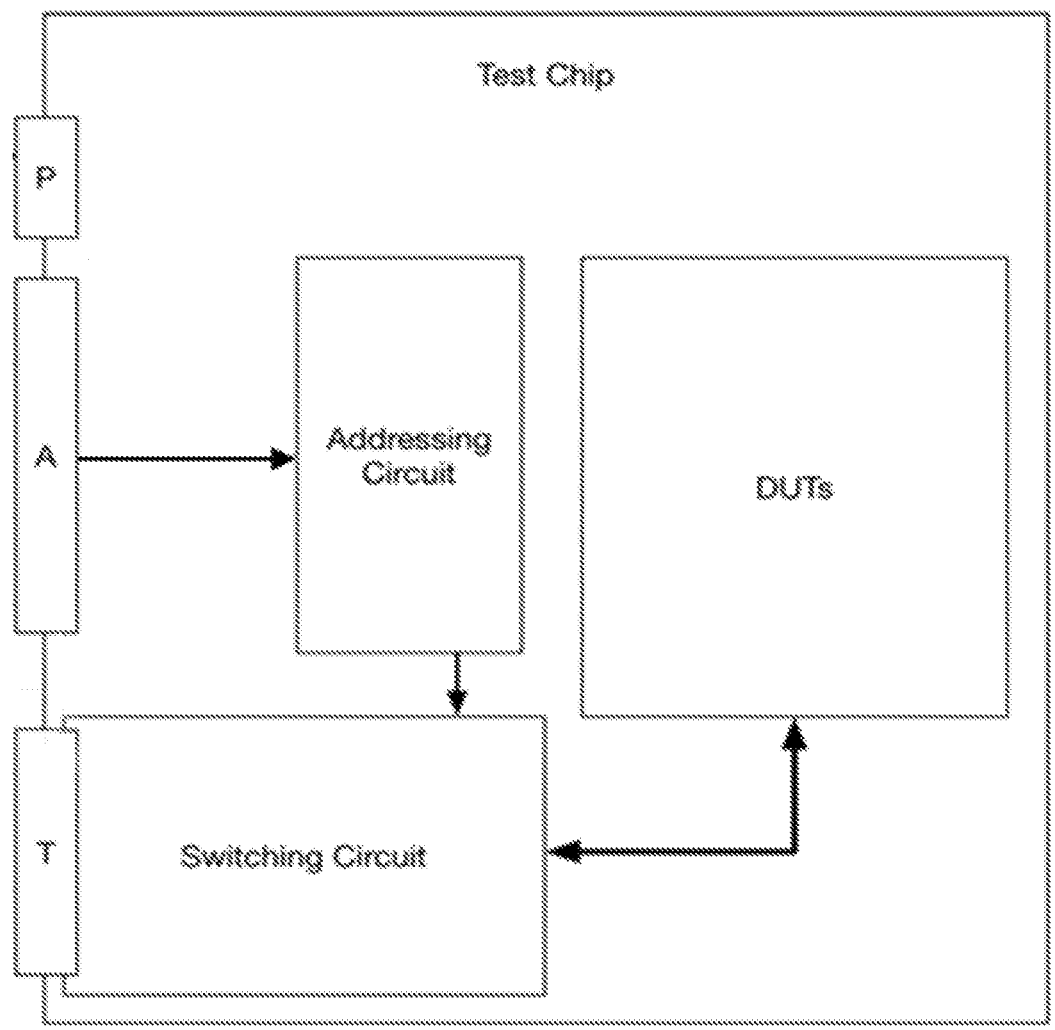
FIG. 6A illustrates a common addressable test chip without address register.
Figure 6B:
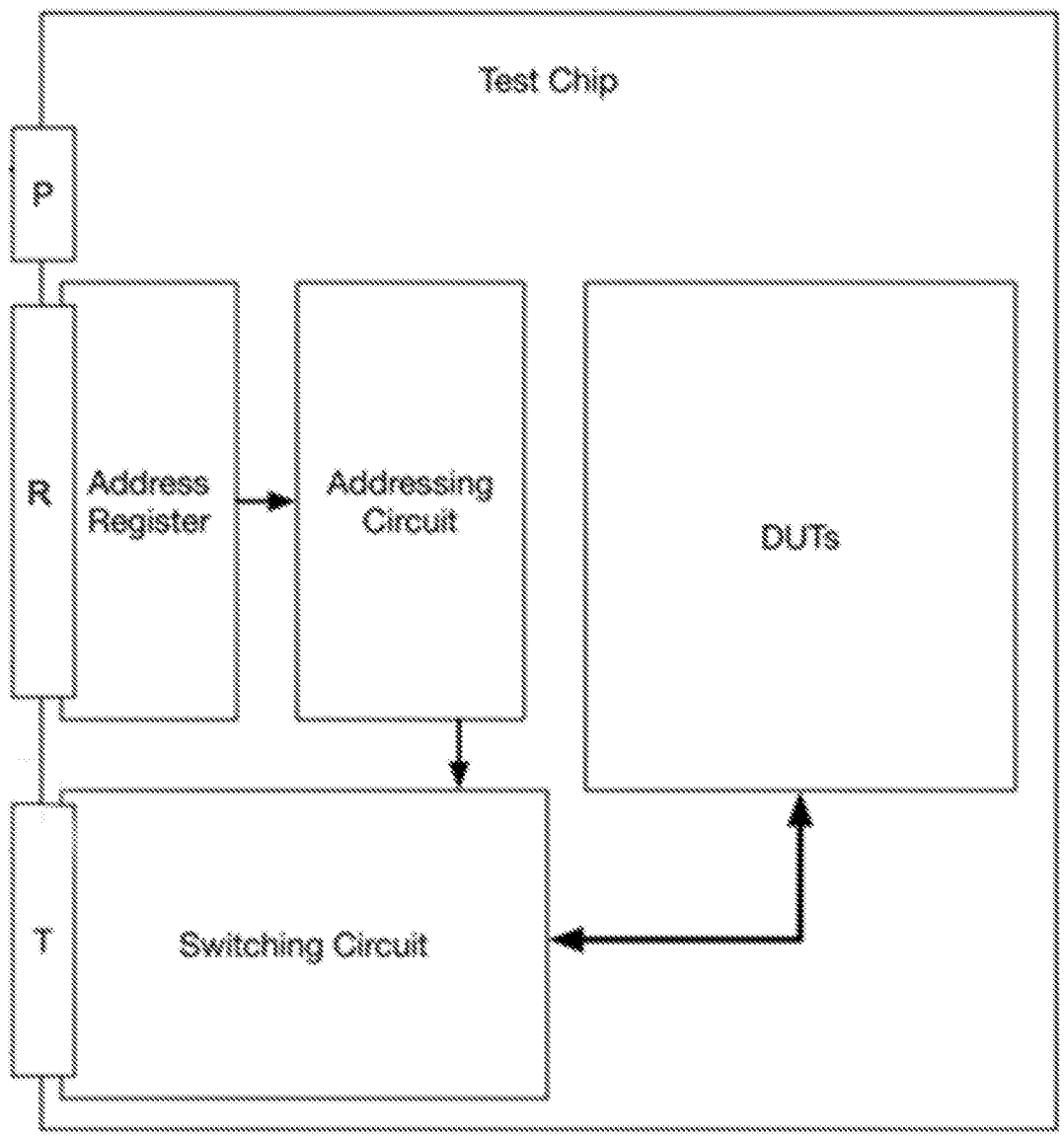
FIG. 6B illustrates a common addressable test chip integrated with address register.

All types of common addressable test chip can be expressed in FIG. 6A. "Power pads" is labeled as "P" in figure, "address signal pads" is labeled as "A," "Test pads" is labeled as "T." In this embodiment, the address register configured in a common addressable test chip can be expressed in FIG. 6B. The input end of the address register connected to the address register pad (is labeled as "R" in figure) of the test chip, the output address signal end of the address register connected to the input end of the addressing circuit, the output of the addressing circuit connected to the first port of the switching circuit, the second and third port of the switching circuit connected to DUTs and test pads (is labeled as "T" in figure) through signal lines. The address register outputs address signals, these address signals are decoded by the addressing circuit as address select signals, these address select signals control switching circuit to select DUT to be tested.

The address signal of common addressable test chip is inputted to addressing circuit through address signal pads (labeled as "A" in FIG. 6A), these address signals are decoded by the addressing circuit as address select signals to control switching circuit to select DUT to be tested, the number of DUT is equal to the number of address select signals, so that, the number of the address signals and the number of address signal pads are determined by the number of address select signals or the number of DUT. For example, there are 128 DUTs, then 128 address select signals are needed. According to the principle of digital signal, 128 address select signals can be generated by 7 ($\log_2 128=7$) address signals, which means that the number of address signal pads is 7. As the development of the IC in high integration degree and high manufacturing area utilization ratio, the test chip faced many demands, much higher density DUTs needed to improve the failure detection rate and save the cost of manufacturing area. But more DUTs means more address signal pads, the area of a pad is much bigger that a DUT in test chip, more address signal pads must limit the number of DUT. To solve this problem, in this embodiment, an address register is integrated into a common addressable test chip to constitute a new type of addressable test chip, only a few of the address register pads instead of many address signal pads which will increase as the number of DUT grows, this type of addressable test chip can greatly improve the area utilization of the test chip, it can accommodate about $10^6$ orders of magnitude DUTs in 10 mm² area.

Figure 7:
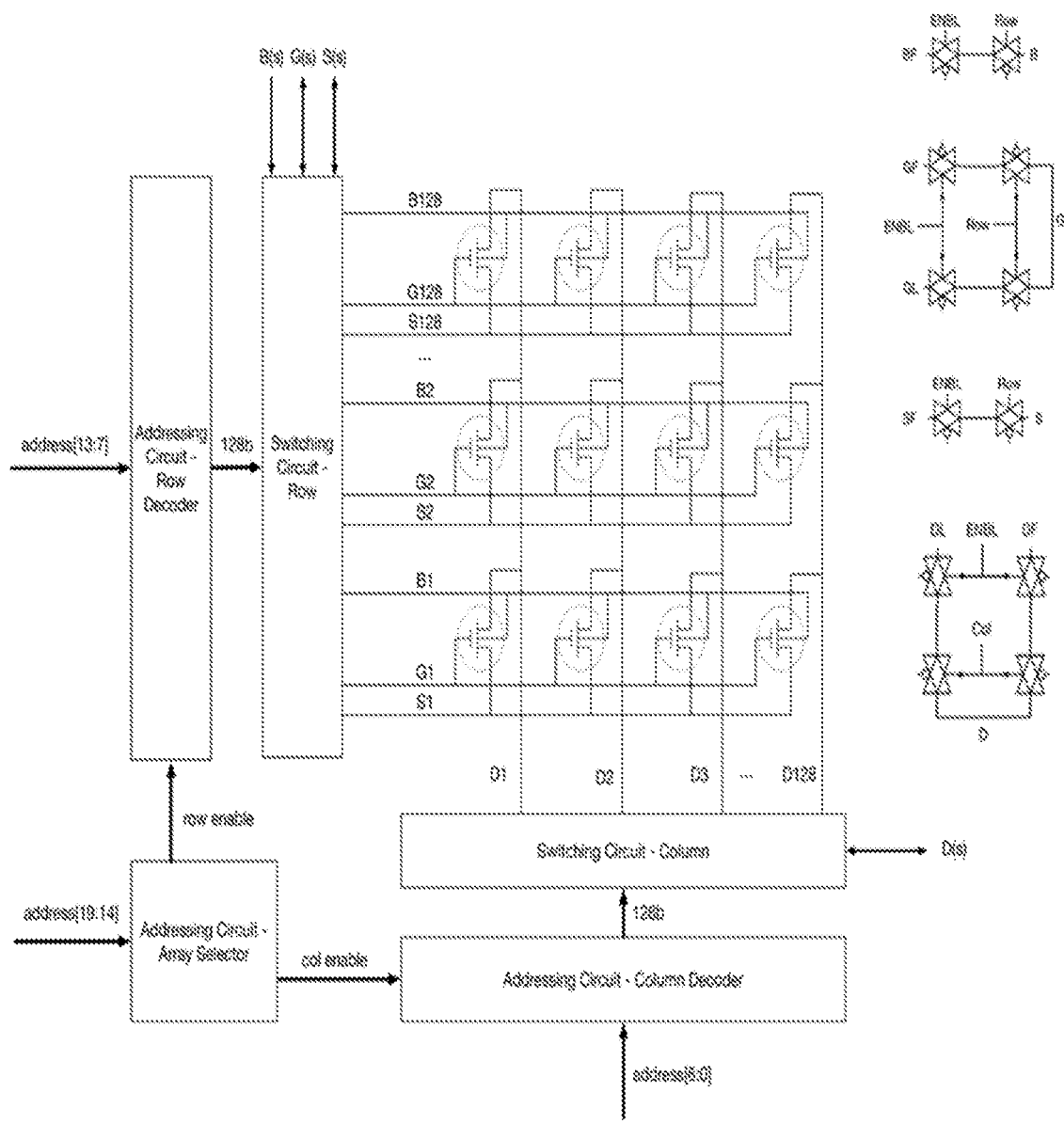
FIG. 7 illustrates an array structure of the type addressable test chip of FIG. 3B according to some embodiments.

In the embodiment, the DUT comprises a transistor, and can employ four-terminal measuring techniques to test the transistor. The layout of the addressable test chip in this embodiment is shown in FIG. 3B and FIG. 7. The test chip includes an address register, several addressing circuits, several switching circuits, a plurality of transistors (DUTs) and a plurality of pads. The test chip occupies an area of 10 mm², all the transistors are divided into 64 (8×8) arrays, each array contains 16,384 (128×128) transistors. This means that, 1,048,576 (8×8×128×128) transistors can be accommodated in the area of 10 mm². Each array is configured with a set of addressing circuit and switching circuit; the addressing circuit includes an array selector, a row decoder and a column decoder. In some embodiments, the buffers are configured to the row and column decoder to solve the problem of too long metal wiring connection and signal integrity.

In this embodiment, the transistors in test chip are divided into 64 ($2^6$) arrays, each array contains 16,384 ($2^7 \times 2^7$) transistors, so that, 20-bit address signals need to be output by the address register. The 6 bit address signals are used to generate $2^6$ array select signals to control one or more arrays in a state of preparing to be test; 7 bit address signals are used to control row decoder to generates $2^7$ row address select signals; 7 bit address signals are used to control column decoder to generates $2^7$ column address select signals; therefore, a single DUT can be selected to be tested in each array which is selected by array select signals.

As shown in FIG. 7, the switching circuit includes a plurality of transmission gates. In each array, the B, S and G ends of transistors in a row are connected respectively to the B, S, G end signal lines which controlled by the row addressing circuit, and the D end of transistors in a column are connected to the D end signal line which is controlled by the column addressing circuit. Specifically, the B end of the transistors in a row are connected to the signal line BF through a transmission gate, the S end of the transistors in a row are connected to the signal line SF through a transmission gate, the G end of the transistors in a row are connected to the signal line GF and GL through a transmission gate respectively, the D end of the transistors in a column are connected to the signal line DF and DL through a transmission gate respectively. The transmission gates at the BF, SF, GF and GL ends are controlled by the address select signal which generated by the row addressing decoder, and the transmission gates at the DF and DL ends are controlled by the address select signal which is generated by the column addressing decoder.

Fourteen pads are needed in the test chip, which includes: the power pads VDD and VSS; input signal pads of address register RST, SE, SI, AEN and CLK; output signal pad of address register SO, and the test pads BF, SF, GF, GL, DF and DL. In all test pads, DF or DL end is output end of test data, when several arrays are tested at the same time (parallel testing), therefore, several pair of DF and DL pads are needed. In some embodiments, all DUTs aren't divided into several arrays and the array select signals is not needed, so that, there is no AEN pads, and the number of pads is 13. The output address register signal (SO) is the lowest position of the address signal which is used for check whether DUT is the one we want to test. In some embodiments, there is no scan data output signal pad SO, and the number of pads is 13. In some embodiments, there are no AEN and SO signals, and the number of pads is 12.

In this embodiment, the test equipment of the test system includes a function generator (labeled as "FGen" in FIG. 8), switch matrix module (labeled as "SWM" in FIG. 8), at least six source measurement units (SMUs), a database and an online analysis engine. Therefore, the test equipment, the probe card and the addressable test chip integrated with address register can constitute the test system of the embodiment, as shown in FIG. 8.

Figure 8:
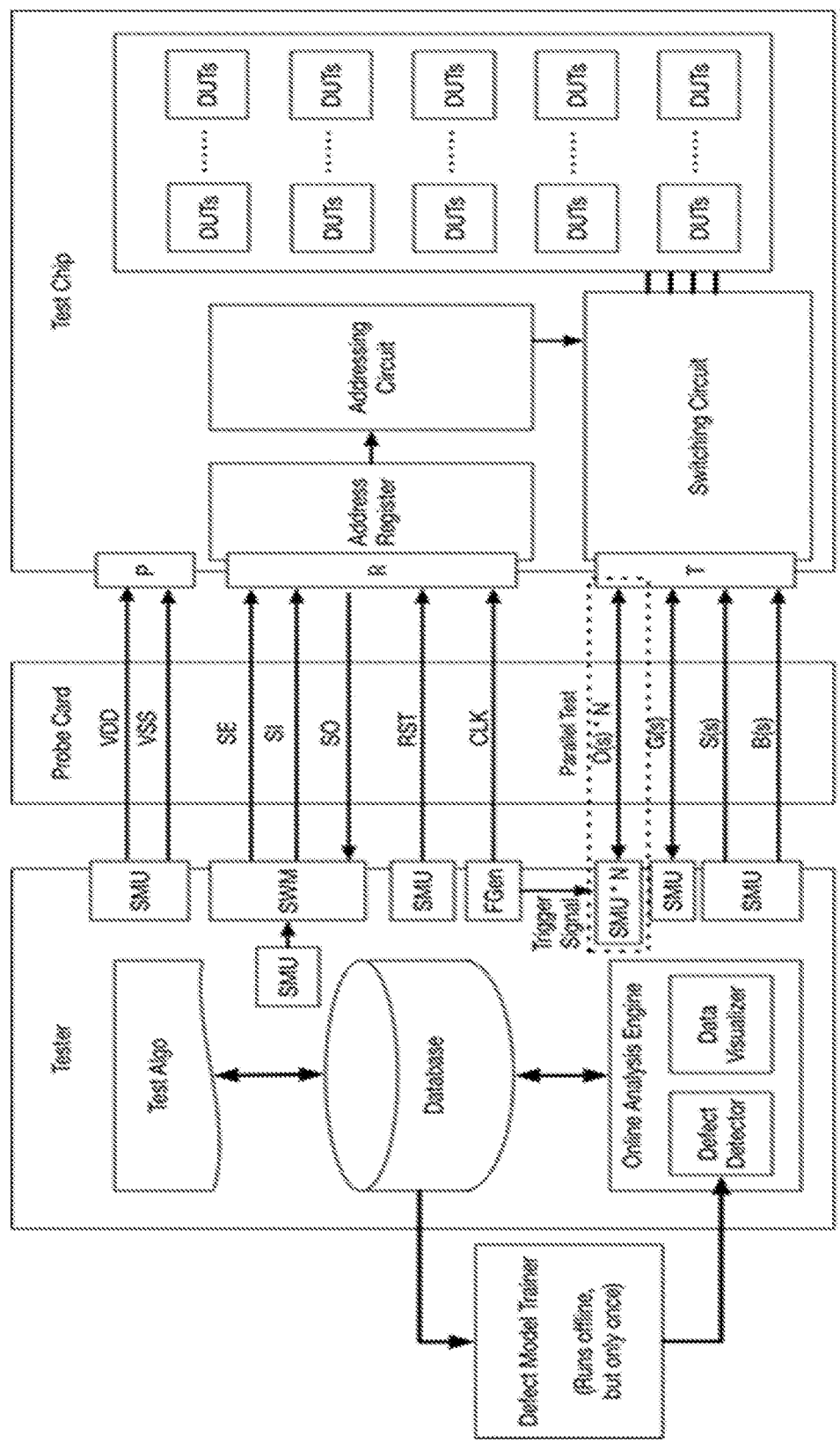
FIG. 8 illustrates an addressable test chip test system according to some embodiments.

In FIG. 8, "power pads" is labeled as "P," "address register pads" is labeled as "R," "test pads" is labeled as "T." The first source measurement unit (SMU) is connected to the power pads VDD and VSS in the addressable test chip through the probe card, the first SMU provides power to the test chip; the second SMU is connected to the switch matrix module, the switch matrix module is connected to the input pads SE, SI and output pad SO of the address register through the probe card; the third SMU is connected to the input pads RST of the address register in the test chip through the probe card; the function generator is connected to the input pads CLK of the address register through the probe card; the fourth, fifth and sixth SMU are test SMUs, and the test SMUs are connected to the test pad DF, DL, GF, GL, SF, SL and BF through the probe card, so as to provide voltage and realize data test for the test chip; the function generator is also connected to test SMUs; the database in the test equipment is used to store data, the online analysis engine is used to analyze the data. In some examples, the online analysis engine is excluded in the equipment, the data can be output and analyzed by external module. In some examples, the database is not an independent structure but integrated in other device, such as some type of SMUs have the function to store data.

Before the test system is tested, the test equipment is configured to connect with the probe card; in response to the test requirement, the test equipment controls the probe card to connect with the addressable test chip; the first SMU provides power for addressable test chip; the function generator generates a clock pulse signal, the clock pulse signal stimulates the address register in addressable test chip to generate address signals, the address signal is decoded to address select signals through addressing circuit, the address select signal controls the switching circuit to select DUT to be tested, at the same time, the clock pulse signal generated by the function generator is fed back into the test SMU of the test equipment to trigger the test equipment to enter the test state; therefore, the test equipment will test the selected DUT immediately when the DUT is selected.

Based on the function of address register, when the shift enable signal SE=1, the shifter logic in the address register is selected, and the address register has the same function as a shift register, the test chip entries the address configuration mode: each time the edge of the clock signal is changed, the address register 1) shifts all address bits right 1 bit, 2) reads the shift data input SI into the highest address bit, and 3) the lowest address bit is discarded. After all address bits have been shifted in, the address register is configured to the desired address. When the shift enable signal SE=0, the counter logic in the address register is selected, and the address register has the same function as a counter, the test chip entries either the sequential test mode if the clock signal is running, or the diagnostic test mode if the clock signal is stopped. In the sequential test mode, each time the edge of the clock signal is changed, the address is transformed to the next address (address+1), and the corresponding DUT is tested by the test equipment; as the clock pulse keeps running, all DUTs will be successively tested by the test equipment. In the diagnostic test mode, the clock signal is stopped, thus the selected DUT will not be changed, the selected DUT can be diagnosed by adjusting the voltages of its terminals, e. g. plot the Id-Vg curve of a transistor DUT, by changing the voltage on gate terminal; if the other DUTs need to be tested, reconfigure the address to select a DUT to test every time.

In some embodiments, the clock pulse signal generated by the function generator is not output into the test SMU directly, but though a buffer to output into the test SMU, the buffer can be configured to test equipment or probe card. The input of the buffer is connected to the output of the function generator, the output terminal of the buffer is connected to the test SMU. When the test requirements occur, the function generator generates a clock pulse signal; the clock pulse signal stimulates the address register in addressable test chip to generate address signals, the address signal are decoded to address select signals through addressing circuit, the address select signal control switching circuit to select DUT to be tested, at the same time, the clock pulse signal is input to the buffer, the buffer fed back the clock pulse signal to the test SMU in the test equipment to trigger the test equipment to enter the test state. The added buffer is used to solve the time difference between selecting DUT and triggering the test equipment to enter the test state.

In some examples, more/less than six source measurement units are configured to the test equipment due to the different types of DUTs and circuit designs. Sometimes, more SMUs is used to keep the circuit more stable, two or more SMU are required to supply power; sometimes, or when the parallel testing is needed, therefore, more pair of DF and DL pads are needed, and more SMUs is needed to connect to DF and DL pads. As shown in FIG. 8, for example, there are N DUTs needed to be tested at the same time, the addressable test chip should be configured with N pair of pads, and the number of the fourth SMU should configure N for the test equipment; in other words, the number of the fourth SMU is same to the number of DUT of parallel testing.

In common test systems, (1) the test state is triggered after testing the DUT is selected; (2) common test system adopts SMU to generate address signal directly, a DUT needs to be selected and test each time, engineer needs to adjust or write test plan to adjust SMU to generate a needed address signal, and the test equipment needs to configure an address for each DUT every time, for numerous DUTs, it is a complicated and tedious work, and the test efficiency is very low.

Figure 9:
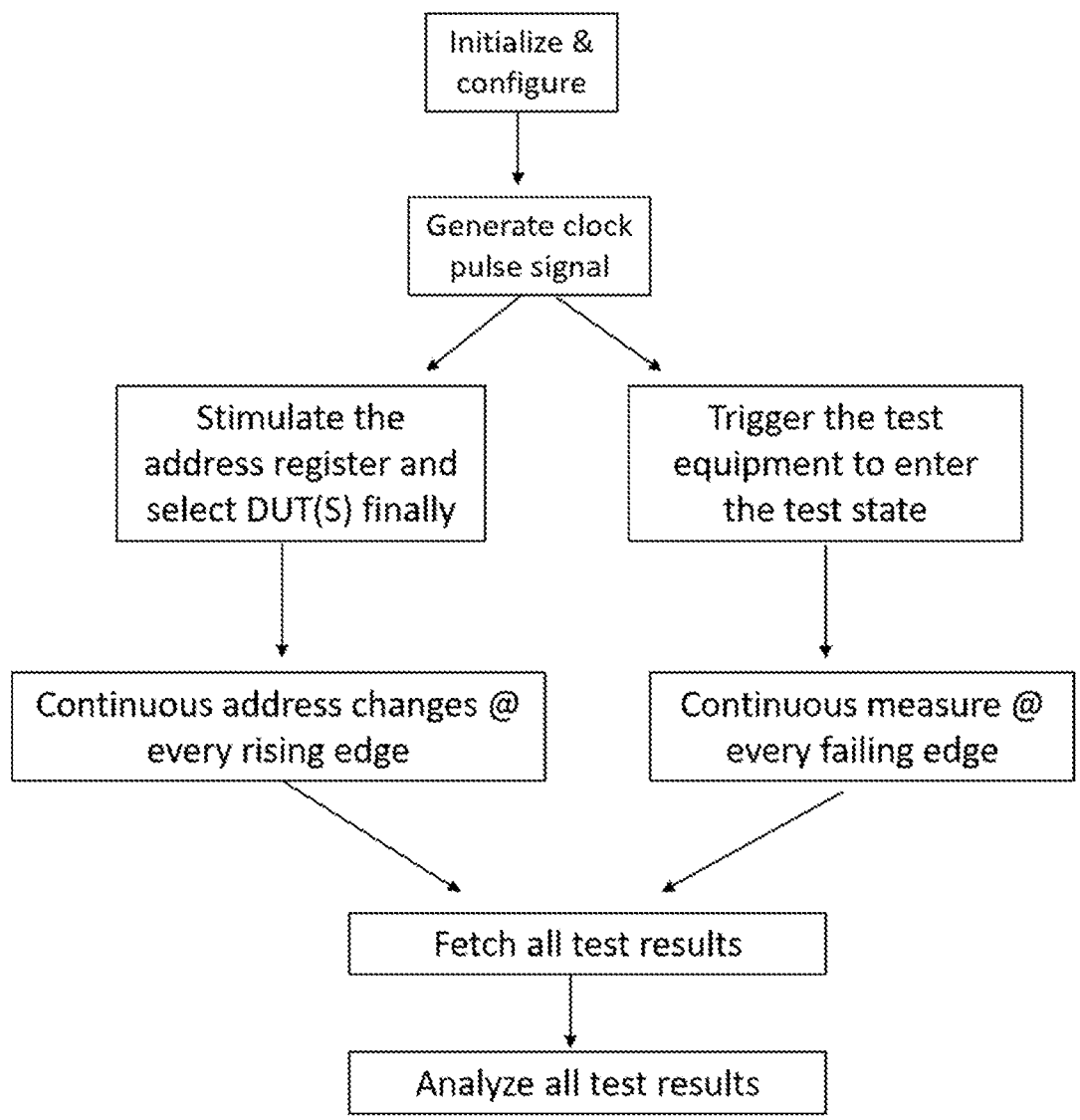
FIG. 9 illustrates the test method of the addressable test chip test system of FIG. 8 according to some embodiments.
Figure 10:
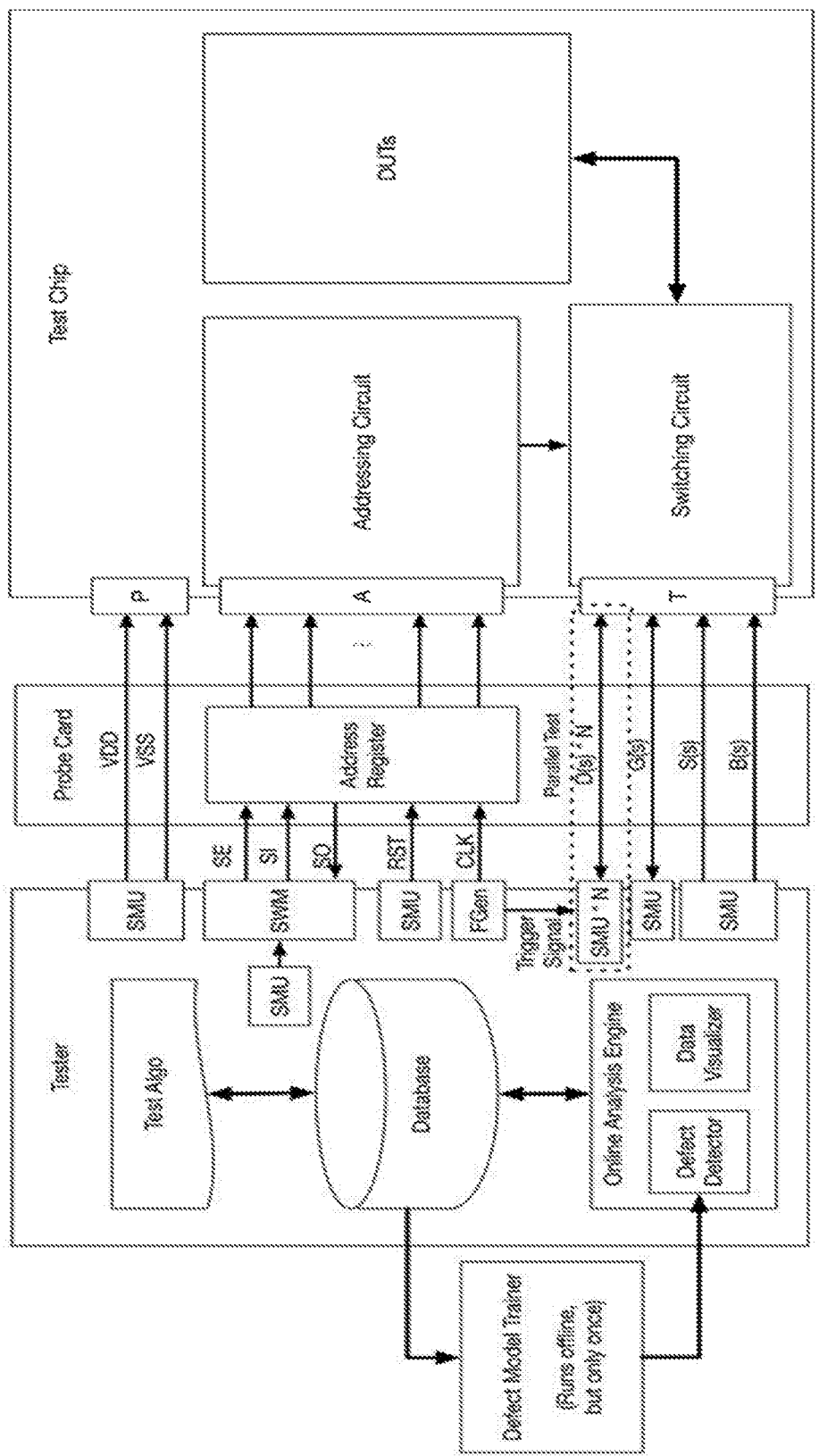
FIG. 10 illustrates an addressable test chip test system according to some embodiments.

In the test system, the function generator is connected to the address register and the test SMU, this connection type can provide a new test method: the selection of DUT in the test chip and enable the test equipment into test state are completed at the same time, and the test efficiency has been greatly improved. The test method is shown in FIG. 9, after initializing and configuring the test equipment, the function generator generates a clock pulse signal, the clock pulse signal stimulates the address register in addressable test chip to generate address signals, the address signals are decoded to address select signals through addressing circuit, the address select signal control switching circuit to select DUT to be tested, at the same time, the clock pulse signal generated by the function generator is fed back into the test SMU of the test equipment to trigger the test equipment to enter the test state; therefore, the test equipment will test the selected DUT immediately when the DUT is selected. All test data is stored into the test SMUs momentarily, when all the tests are completed, the test algorithm (test algo) will control the database to fetch all test results, the online analysis engine will analyze all test results and store them into a database. In some examples, the online analysis engine is excluded in the equipment, the data can be output and analyzed by external module. In some examples, the database is not an independent structure but can be integrated in other devices, such as some types of SMUs that have the functions to store data.

Moreover, in the test system of the invention, the address register can implement the logic function of the counter and the shifter. Continuous address signals can be generated when the counter logic is used, the devices can be quickly tested by the test system without reading test plan and adjusting the SMU.

Example 2

An addressable test chip test system includes a test equipment, a probe card and an addressable test chip, the test equipment connects to the addressable test chip through the probe card to constitute a test path. An address register is integrated in the probe card, the address register is a new type of address register in EXAMPLE 1. The test equipment of this embodiment is the same as the test equipment in EXAMPLE 1, the addressable test chip in this embodiment is a common addressable test chip as shown in FIG. 5A.

In the test system, the first SMU in the test equipment connected to the probe card, the probe card connected to the addressable test chip through the power pads (labeled as "P" in FIG. 9) VDD and VSS; the second SMU connected to the switch matrix module (labeled as "SWM" in FIG. 8), and the switch matrix module connected to the address register through the shift enable signal SE, the shift data input signal SI and the scan data output signal SO, the address register connected to address signal pads in the addressable test chip; the third SMU connected to the address register through the reset signal RST; the function generator connected to the address register through the clock signal CLK; the fourth, fifth and sixth SMU are test SMUs, and these test SMUs connected to the test pad DF, DL, GF, GL, SF, SL, BF through the probe card; the function generator also connected to the test SMU in the equipment; the online analysis engine and the database connected to the test SMU, and the online analysis engine is used to analyze test results, the database is used to store data. In some examples, the online analysis engine is excluded in the equipment, the data can be output and analyzed by an external module. In some examples, the database is not an independent structure but can be integrated in other devices, such as some types of SMUs that have the functions to store data.

Before the test system is tested, the test equipment is configured to connect with the probe card; in response to the test requirement, the test equipment controls the probe card to connect with the addressable test chip; the first SMU provides power for addressable test chip; the function generator generates a clock pulse signal, the clock pulse signal stimulates the address register in addressable test chip to generate address signals, the address signals are decoded to address select signals through addressing circuit, the address select signal control switching circuit to select DUT to be tested, at the same time, the clock pulse signal generated by the function generator is fed back into the test SMU of the test equipment to trigger the test equipment to enter the test state; therefore, the test equipment will test the selected DUT immediately when the DUT is selected. Based on the function of address register, when SE=1, the shifter logic in the address register is selected, and the address register has the same function of a shift register, the test chip entries the address configuration mode: each time the edge of the clock signal is changed, the address register reads an address data from the shift data input signal SI, and the selected DUT will be tested by the test equipment, when the DUT test is completed, the test system will read the test plan and according to the next address data will select the next DUT to be tested; when SE=0, the counter logic in the address register is selected, and the address register has the same function of a counter, the test chip entries the sequential test mode: each time the edge of the clock signal is changed, the address bit is transformed to the next address bit, all DUTs will be successively and fast tested by the test equipment from the first DUT to the last DUT without reading the test plan.

In some embodiments, the clock pulse signal generated by the function generator is not output into the test SMU directly, but though a buffer to output into the test SMU, the buffer can be configured to test equipment or a probe card. The input of the buffer is connected to the output of the function generator, the output terminal of the buffer is connected to the test SMU. When the test requirements occur, the function generator generates a clock pulse signal; the clock pulse signal stimulates the address register in addressable test chip to generate address signals, the address signals are decoded to address select signals through addressing circuit, the address select signal control switching circuit to select DUT to be tested, at the same time, the clock pulse signal is input to the buffer, the buffer fed back the clock pulse signal to the test SMU in the test equipment to trigger the test equipment to enter the test state. The added buffer is used to solve the time difference between selecting DUT and triggering the test equipment to enter the test state.

In some examples, more/less than six source measurement units are configured to the test equipment due to the different types of DUTs and circuit designs. In some cases, more SMUs is used to keep the circuit more stable, two or more SMU are required to supply power; sometimes, or when the parallel testing is needed, therefore, more pair of DF and DL pads are needed, and more SMUs is needed to connect to DF and DL pads. As shown in FIG. 8, for example, there is N DUTs needed to be tested at the same time, the addressable test chip should be configured with N pair of pads, and the number of the fourth SMU should configure N for the test equipment; in other words, the number of the fourth SMU is same to the number of DUT of parallel testing.

The test method is the same to EXAMPLE 1. The differences with EXAMPLE 1 can include, for example, integrating the address register into a probe card not into a common addressable test chip, although the DUT density of common addressable test chip is less than 1000/mm2. This method is very convenient because of the simple design and mature manufacturing process of probe card, the performance of the address register is stable, and the probe card can be reused to realize the recycling of resources.

Example 3

As mentioned in EXAMPLE 1 and EXAMPLE 2, for an addressable test chip, there may be three most common layout structures, as shown in FIG. 3A, FIG. 4A, FIG. 5A. Combining with the address register disclosed in the invention, three new types of addressable test chips are configured with address register, as shown in FIG. 3B, FIG. 4B, and FIG. 5B. In practice, by using the test system disclosed in the invention or other test system to test these chips, it is difficult to obtain accurate resistance due to IR-drop, since accurate resistance measurement is the base of open/short defect identification.

In order to solve the problem of accurate resistance measurements, in this embodiment, a new type of addressable test chip is disclosed. Common addressable test chip includes a plurality of pads, at least one addressing circuit, at least one switching circuit and DUTs; the DUTs can be divided to one or more DUT arrays, a pair of addressing circuit and switching circuit are configured to each DUT array; the addressing circuit includes a set of rows and columns addressing circuit; the switching circuit includes a set of rows and columns switching circuit. The new type of addressable test chip can be configured with at least one addressing circuit and at least two switching circuits; defining a forcing circuit includes an addressing circuit and a switching circuit; defining a sensing circuit includes an addressing circuit and a switching circuit; a DUT array is configured with a pair of forcing circuit and sensing circuit.

Figure 3C:
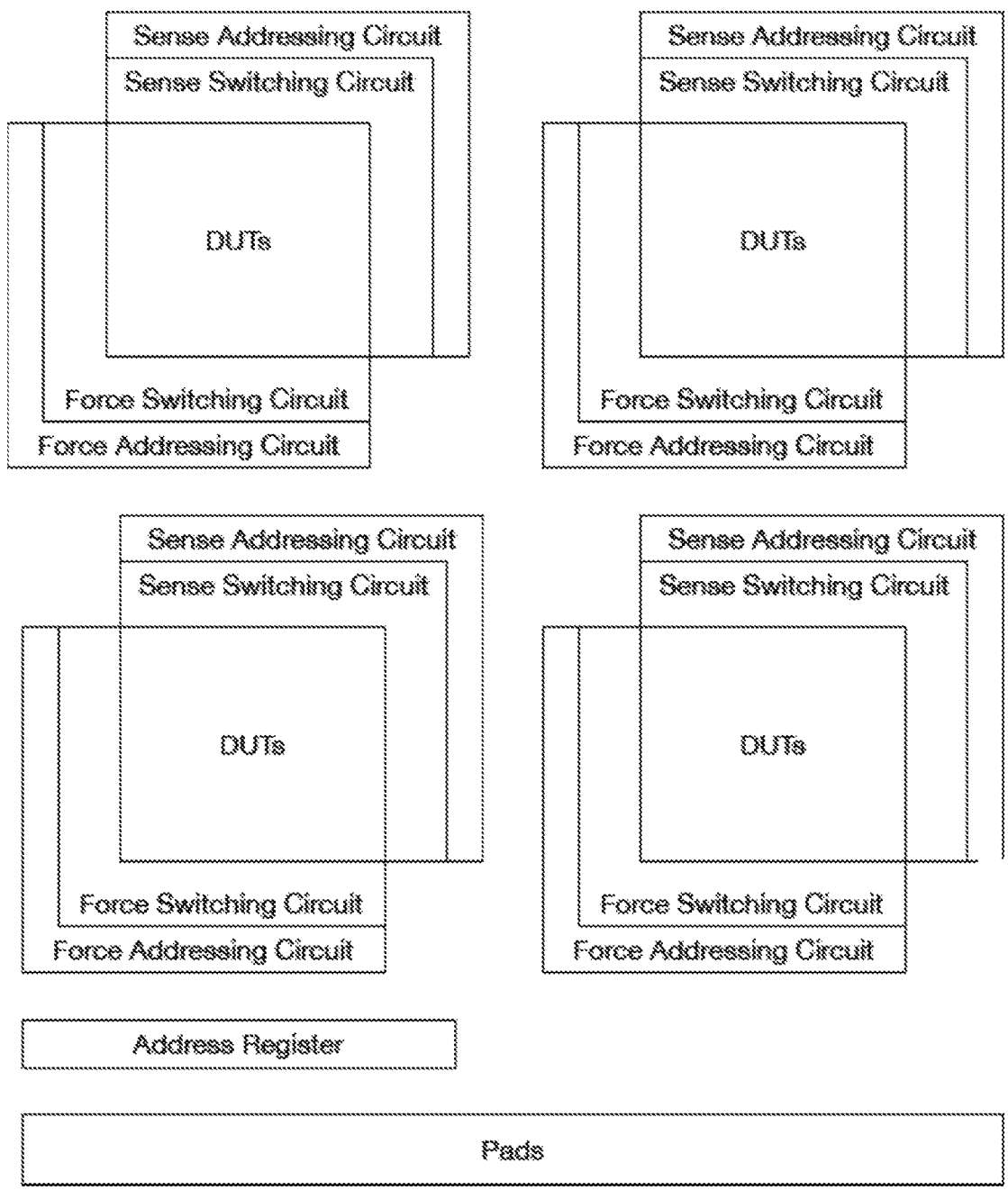
FIG. 3C illustrates a type of addressable test chip integrated with an address register and sensing circuits.
Figure 4C:
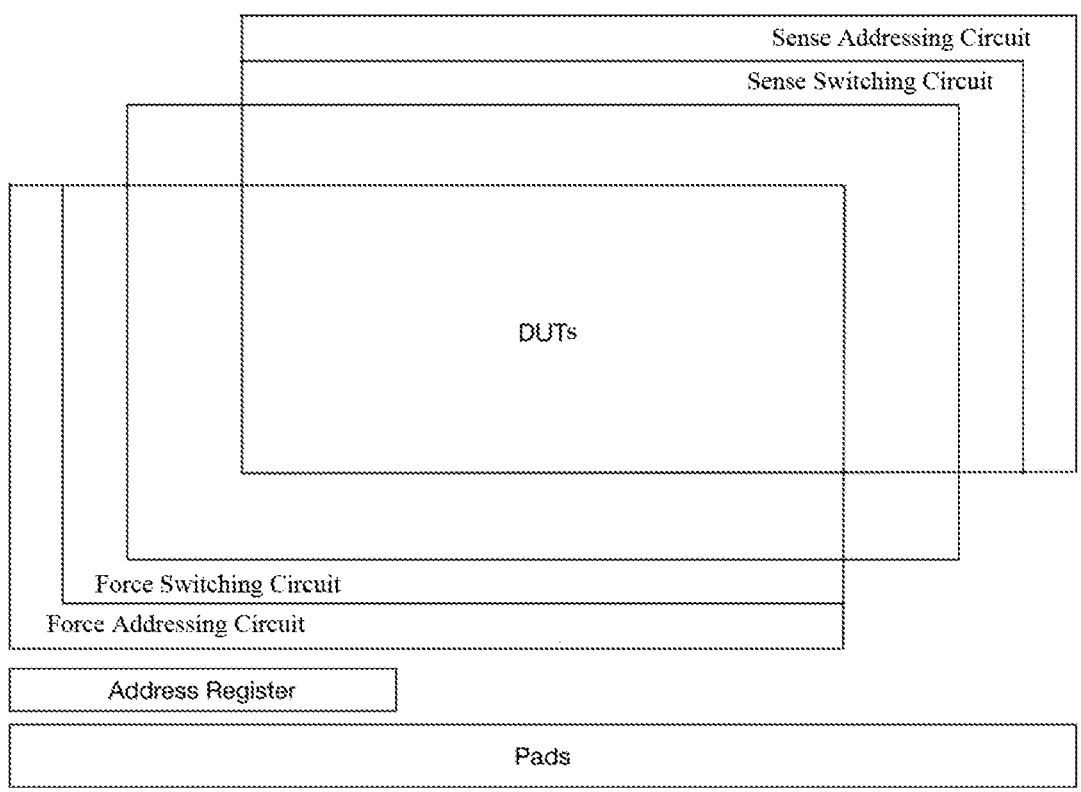
FIG. 4C illustrates a type of addressable test chip integrated with address register and a sensing circuit.

As shown in FIG. 3C and FIG. 4C, the new type of addressable test chip can include a plurality of pads, at least one forcing circuit, at least one sensing circuit, and DUTs. The DUTs can be divided to one or more DUT arrays, a pair of forcing circuit and sensing circuit are configured to each DUT array; each forcing circuit includes a force addressing circuit and a force switching circuit, each sensing circuit includes a sense addressing circuit and a sense switching circuit; for each DUT array, the force addressing circuit and sense addressing circuit connect to address signal pads and obtain address signal through the address signal pads, and also connect to the force switching circuit and sense switching circuit respectively, and output address select signals to control switches of the force switching circuit and sense switching circuit in on-state or off-state; the force and sense switching circuits connect to DUTs and select the same DUT to be tested through the state of switches. The force addressing circuit and sense addressing circuit also connect to the power pads and the power pads supply power for the whole test chip, the force and sense switching circuits also connect to test pads and the test pads supply test points for the whole test chip.

In some examples, the forcing circuit and sensing circuit also can be configured in common addressable test chip and other kinds of addressable test chips to improve the accuracy of resistance measurements.

Figure 11:
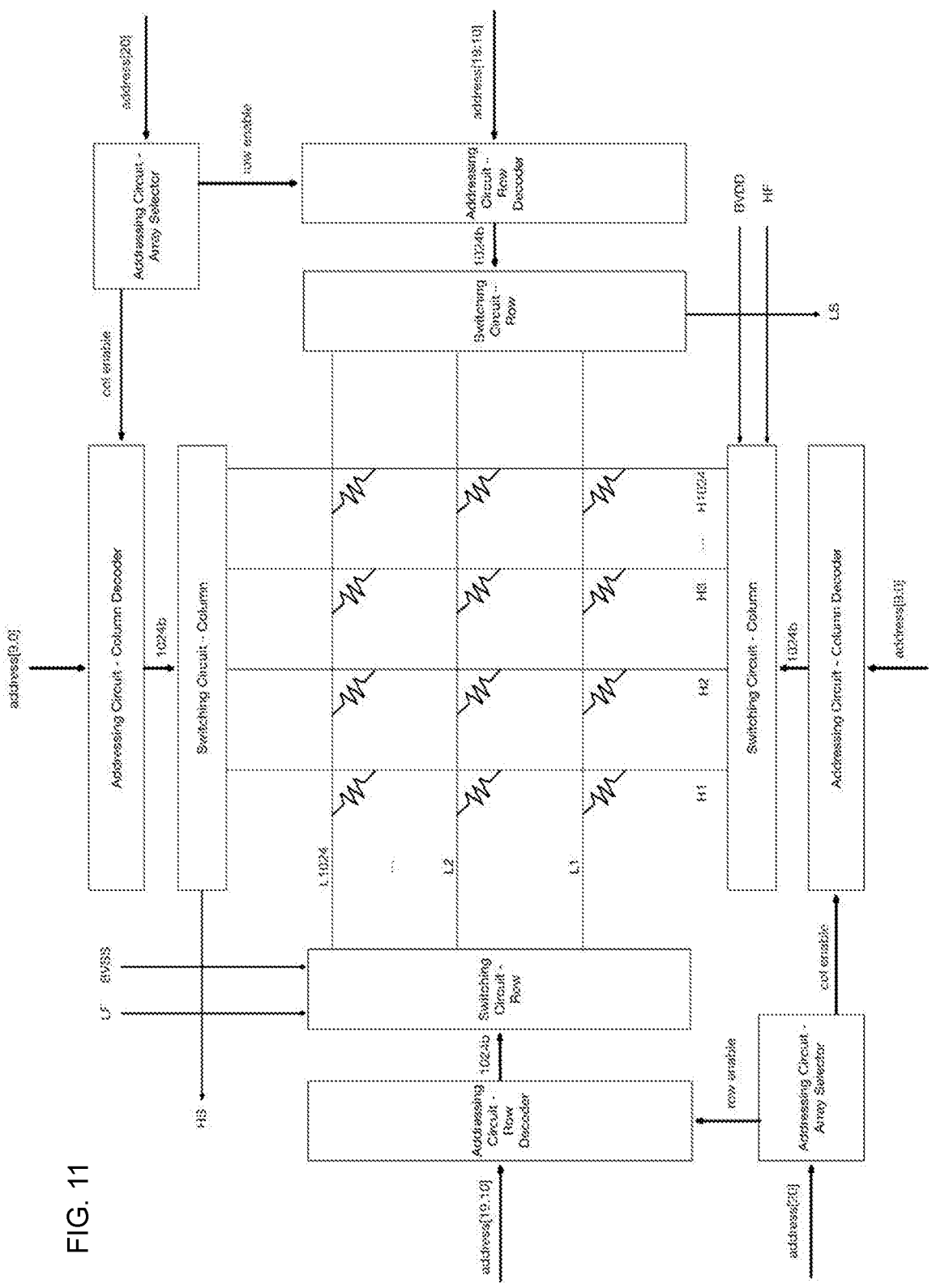
FIG. 11 illustrates a type of addressable test chip equipped with sensing circuit.
Figure 12:
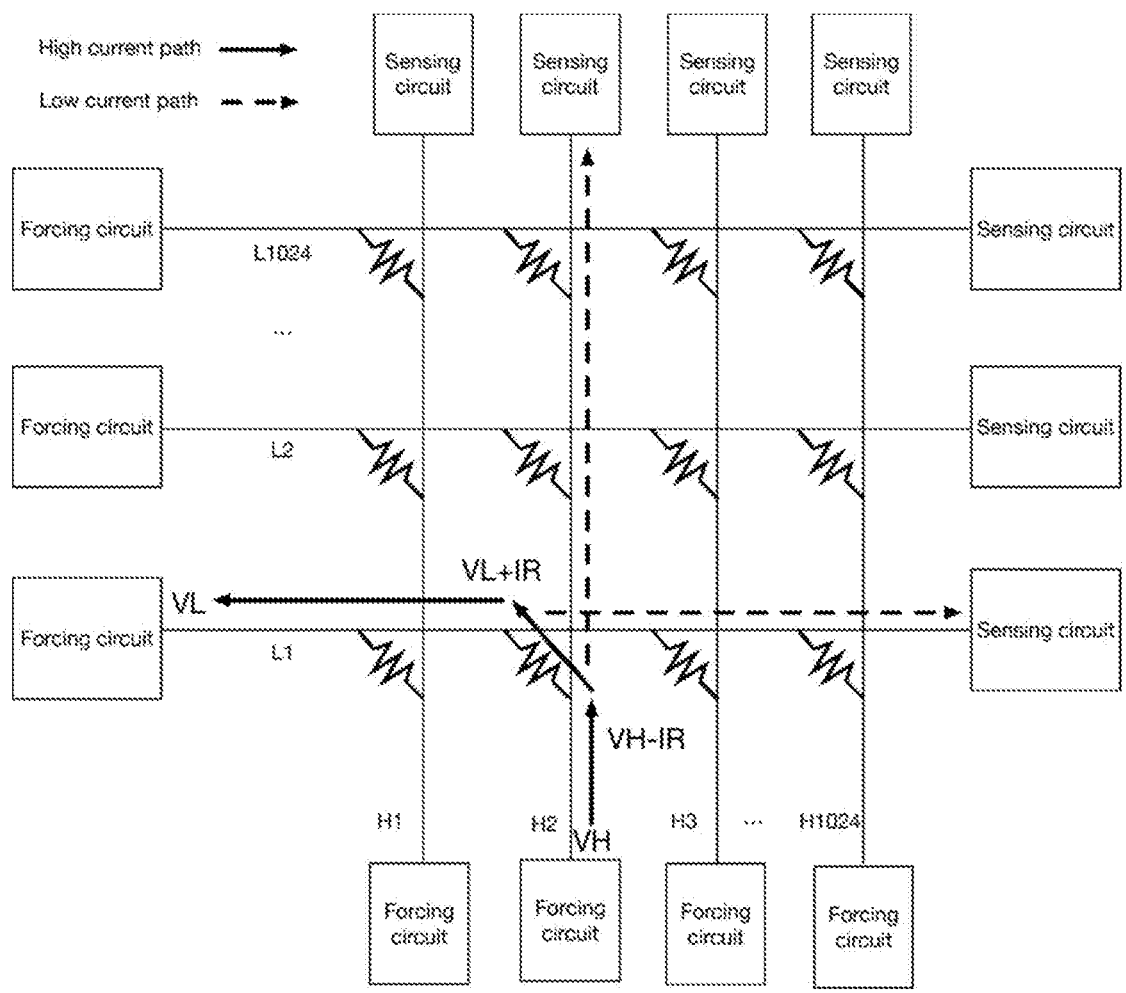
FIG. 12 illustrates a type of addressable test chip equipped with sensing circuit.

In this example, as shown in FIG. 11 and FIG. 12, the forcing circuit and sensing circuit are configured to a common addressable test chip without an address register, in the two drawings, the DUT in the addressable test chip is resistor. For each DUT array, the force addressing circuit and sense addressing circuit connect to address signal pads and obtain address signal through the address signal pads, the two addressing circuits also respectively connect to the force switching circuit and sense switching circuit, and outputs address select signals to control switches of the force switching circuit and sense switching circuit in on-state or off-state; the force and sense switching circuits connect to DUTs and select a DUT to be tested through the switches' state. The force and sense addressing circuits also connect to the power pads and the power pads supply power for the whole test chip, the force and sense switching circuits also connect to test pads and the test pads supply test points for the whole test chip.

A new type of addressable test chip also suitable for the test equipment and the test system are disclosed in this invention. The addressable test chip can be regarded as having at least one forcing circuit and at least one sense circuit, in some examples, the structure of forcing and sensing circuits are the same.

Figure 13A:
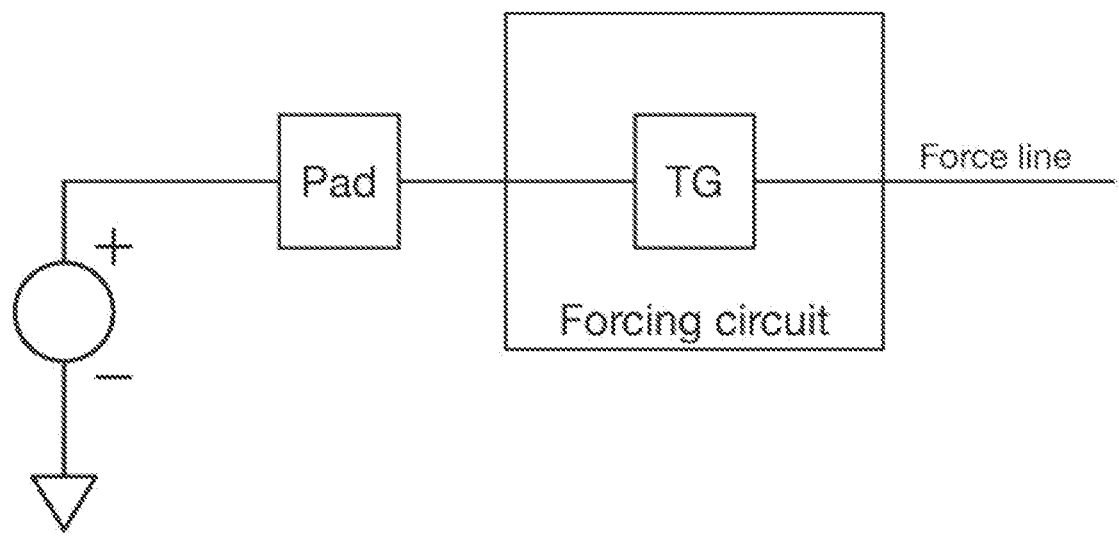
FIG. 13A illustrates a type of forcing circuit connected to a voltage source via a pad.
Figure 13B:
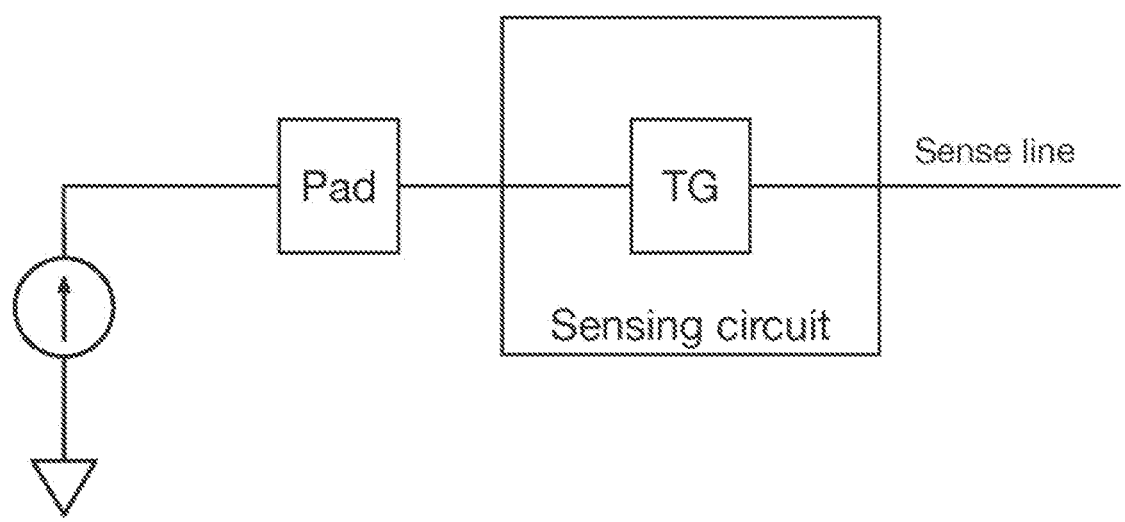
FIG. 13B illustrates a type of sensing circuit connected to a current source via a pad.

As shown in FIG. 13A and FIG. 13B, in the forcing circuit, the switching circuit (labeled as "TG" in FIG. 13A) connected to a voltage source via a pad, the voltage source supplies the desired voltage, due to IR-drop, the voltage on force line and the voltage source may be different; in the sensing circuit, the switching circuit (labeled as "TG" in FIG. 13B) connected to a current source via a pad, the current source supplies a small current, such as $10^{-12}$ A, the voltage sensed at the current source will be very close to the voltage on sense line because of very low current along the sense line, therefore, resistance of the selected DUT can be accurately measured.

In some examples, the sensing circuit also can be configured to common addressable test chip and other kinds of addressable test chips to improve the accuracy of resistance measurements.

Example 4

A new type of addressable test chip is disclosed in example 3, at least one forcing circuit and at least one sensing circuit are configured in this type of addressable test chip; each forcing circuit can include an addressing circuit and a switching circuit, each sensing circuit can also include an addressing circuit and a switching circuit. One or more DUT arrays can be included in this type of addressable test chip, where each DUT array can be configured with a pair of forcing circuit and sensing circuit; for each DUT array, the switching circuits in the forcing circuit and the sensing circuit can select the same DUT to be tested.

The differences between this example and example 3 can include, in this example, the number of addressing circuit is less than the number of switching circuit, for each DUT array that is needed to configure with a pair of forcing circuit and sensing circuit, one addressing circuit can be shared by the pair of forcing circuit and sensing circuit. The addressing circuit connect to address signal pads and obtain address signal through the address signal pad, the addressing circuit also respectively connect to two switching circuits, the address select signals output from the addressing circuit can control switching circuits in on-state or off-state.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An address register comprises:
   a plurality of edge-triggered flip-flop registers;
   at least one counter logic;
   at least one shifter logic;
   a multiplexer;
   input ports including a reset signal RST, a clock signal CLK, a shift enable signal SE, a shift data input signal SI;
   an output port including address signals ADDR;
   wherein:
   an input D of the plurality of edge-triggered flip-flop registers is coupled to a data output of the multiplexer;
   an input R of the plurality of edge-triggered flip-flop registers is coupled to a reset (RST) pad of the address register;
   an input CK of the plurality of edge-triggered flip-flop registers is coupled to a clock (CLK) pad of the address register;
   an output Q of the plurality of edge-triggered flip-flop registers is coupled to an address (ADDR) pad of the address register;
   an input of the counter logic is coupled to the address (ADDR) pad of the address register;
   an input of the shifter logic is coupled to the address (ADDR) pad and the shift data input signal SI; and
   an input of the multiplexer is coupled to the shift enable signal SE, an output of the counter logic, and an output of the shifter logic;
   wherein the counter logic is configured to, when selected through the input of the counter logic, trigger continuous address signals to thereby enable fast testing without reading a test plan or adjusting source measurement units (SMUs).

2. An address register, comprising:
   a plurality of edge-triggered flip-flop registers;
   at least one counter logic;
   at least one shifter logic;
   a multiplexer;
   input ports including a reset signal RST, a clock signal CLK, a shift enable signal SE, a shift data input signal SI;
   an output port including address signals ADDR;
   wherein:
   an input D of the plurality of edge-triggered flip-flop registers is coupled to a data output of the multiplexer;
   an input R of the plurality of edge-triggered flip-flop registers is coupled to a reset (RST) pad of the address register;
   an input CK of the plurality of edge-triggered flip-flop registers is coupled to a clock (CLK) pad of the address register;
   an output Q of the plurality of edge-triggered flip-flop registers is coupled to an address (ADDR) pad of the address register;
   an input of the counter logic is coupled to the address (ADDR) pad of the address register;
   an input of the shifter logic is coupled to the address (ADDR) pad and the shift data input signal SI; and
   an input of the multiplexer is coupled to the shift enable signal SE, an output of the counter logic, and an output of the shifter logic;
   wherein:
   the shift enable signal SE controls the multiplexer; and
   a signal is configured for selection of one device to work between the counter logic and the shifter logic:
   when SE=1, the shifter logic in the address register is selected, and the address register has the same function of a shift register;
   when SE=0, the counter logic in the address register is selected, and the address register has the same function of a counter.

3. An address register of claim 1, comprising:
   a plurality of edge-triggered flip-flop registers;
   at least one counter logic;
   at least one shifter logic;
   a multiplexer;
   input ports including a reset signal RST, a clock signal CLK, a shift enable signal SE, a shift data input signal SI;
   an output port including address signals ADDR;
   wherein:
   an input D of the plurality of edge-triggered flip-flop registers is coupled to a data output of the multiplexer;
   an input R of the plurality of edge-triggered flip-flop registers is coupled to a reset (RST) pad of the address register;
   an input CK of the plurality of edge-triggered flip-flop registers is coupled to a clock (CLK) pad of the address register;
   an output Q of the plurality of edge-triggered flip-flop registers is coupled to an address (ADDR) pad of the address register;
   an input of the counter logic is coupled to the address (ADDR) pad of the address register;
   an input of the shifter logic is coupled to the address (ADDR) pad and the shift data input signal SI; and
   an input of the multiplexer is coupled to the shift enable signal SE, an output of the counter logic, and an output of the shifter logic;
   wherein the address register further comprises a scan data output signal (SO) output port configured to output the lowest bit of the address signal ADDR which is used to check whether DUT is the one we want to test.

4. An addressable test chip test system including an address register comprising:

a plurality of edge-triggered flip-flop registers;
at least one counter logic;
at least one shifter logic;
a multiplexer;
input ports including a reset signal RST, a clock signal CLK, a shift enable signal SE, a shift data input signal SI;
an output port including address signals ADDR;
wherein:
an input D of the plurality of edge-triggered flip-flop registers is coupled to a data output of the multiplexer;
an input R of the plurality of edge-triggered flip-flop registers is coupled to a reset (RST) pad of the address register;
an input CK of the plurality of edge-triggered flip-flop registers is coupled to a clock (CLK) pad of the address register;
an output Q of the plurality of edge-triggered flip-flop registers is coupled to an address (ADDR) pad of the address register;
an input of the counter logic is coupled to the address (ADDR) pad of the address register;
an input of the shifter logic is coupled to the address (ADDR) pad and the shift data input signal SI; and
an input of the multiplexer is coupled to the shift enable signal SE, an output of the counter logic, and an output of the shifter logic;
the system comprising:
a probe card;
an addressable test chip; and
a test path coupling the addressable test chip with a test equipment through the probe card;
wherein:
the addressable test chip includes a plurality of test pads, at least one addressing circuit(s), at least one switching circuit, and a plurality of devices under test (DUTs);
the DUTs comprise one or more DUT arrays, a pair of addressing circuit and switching circuit are configured to each DUT array;
said addressing circuit(s) are configured to obtain the address signals ADDR through the plurality of test pads, and output address select signals to control switches of the switching circuit in an on-state or an off-state;
said switching circuit(s) are configured to select one of the DUTs to be tested through the on-state or off-state of the switches; and
said address register is integrated in one of said probe card or the addressable test chip.

5. The addressable test chip test system of claim 4, wherein:
the addressable test chip includes a plurality of pads, at least one forcing circuit, at least one sensing circuit, and a plurality of DUTs;
the forcing circuit includes an addressing circuit and a switching circuit;
the sensing circuit includes an addressing circuit and a switching circuit;
each DUT array is configured with a pair of forcing circuit and sensing circuit, wherein one addressing circuit is shared by the pair of forcing circuit and second circuit;
for each DUT array, the addressing circuit of the forcing circuit and the addressing circuit of the sensing circuit connect to address signal pads and obtain address signal to control switches of the force switching circuit and sense switching circuit in on-state or off-state;
the switching circuits of the forcing and sensing circuits are configured to select one of the DUTs to be tested through the on-state or off-state of the switches.

6. The addressable test chip test system of claim 5, wherein,
the forcing circuit is connected to a voltage source and the voltage source supplies the desired voltage;
the sensing circuit is connected to a current source and the current source supplies a small current.

7. The addressable test chip test system of claim 4, wherein:
the test equipment comprises: a function generator, a switch matrix module, a plurality of source measurement units (SMUs) and at least one database;
at least one of said SMUs is configured to provide power supply for a test object;
at least one of said SMUs is connected to the switch matrix module;
at least one of said SMUs used to connect the address register;
at least two of said SMUs are test SMUs, and said test SMUs are connected to the ports of each of the plurality of DUTs, and said test SMUs are connected to the function generator; and
the database is used to store test results.

8. The addressable test chip test system of claim 7, wherein:
the test system comprises the test equipment, the probe card and the addressable test chip, the test equipment connected to the addressable test chip through the probe card to constitute a test path: the address registers are connected to the addressing circuit(s) in the addressable test chip;
at least one of said SMUs in the test equipment is connected to the test pads in the addressable test chip through the probe card, at least one of said SMUs is connected to the switch matrix module, the switch matrix module is connected to the address register, and the SMU is connected to the switch matrix module wherein said switch matrix module provides the shift enable signal SE and the shift data input signal SI for the address register through the switch matrix module;
at least one of said SMUs is connected to the address register through the probe card to provide the reset signal RST for the address register;
the function generator is connected to the address register through the probe card to provide the clock signal CLK for the address register; at least two of said SMUs are test SMUs, and the test SMUs are connected to the switching circuit of the addressable test chip through the probe card; and
the function generator is connected to said test SMUs.

9. The addressable test chip test system of claim 8, wherein, each of the plurality of SMUs in the test equipment is connected to the probe card through the switch matrix module.

10. The addressable test chip test system of claim 8, wherein, a plurality of buffers are configured to the addressing circuits to solve the problem of too long metal wiring connection and signal integrity.

11. The addressable test chip test system of claim 8, wherein, a plurality of buffers are configured in one of the test equipment and the probe card of the test system, and the function generator not being connected directly with the test SMUs, but is connected to the test SMUs through one of the plurality of buffers.

12. The addressable test chip test system of claim 8, wherein, each of the plurality of SMUs is configured to supply power to keep the test system more stable.

13. The addressable test chip test system of claim 8, wherein each of the plurality of SMUs is configured to the test equipment: when the parallel testing is needed, a plurality of DUTs are selected and tested simultaneously, one of test results output terminal is configured to one of the plurality of SMUs.

14. The addressable test chip test system of claim 8, wherein:
the system is configured to execute a test method including: before the test system is tested, the test equipment is configured to connect with the probe card;
in response to a test requirement, the test equipment controls the probe card to connect with the addressable test chip;
the function generator generates clock pulse signals, the clock pulse signal stimulates the address register to generate said address signals, one of said address signals is decoded to address select signals through one of said addressing circuit(s) in the addressable test chip, the address select signal controls one of said switching circuit(s) to select one of said DUTs to be tested, at the same time, the clock pulse signal generated by the function generator is output into the test SMUs in the test equipment to trigger the test equipment to enter a test state;
the test equipment tests the selected DUT immediately when the DUT is selected; and
said test results are stored in the database.

15. The addressable test chip test system of claim 8, wherein:
based on the function of the address register, when the shift enable signal SE=1, the addressable test chip test system executes an address configuration mode as follows:
A1, power on the test system;
A2, configure the SMUs and the function generator;
A3, set the reset signal RST=1 and maintain more than 100 μs, then turn the reset signal RST=0;
A4, set the shift enable signal SE=1, the addressable test chip entries the address configuration mode;
A5, the variable i is assigned to the address data bit N, the shift data input signal SI is assigned to the i-th of the address data bit;
A6, maintain more than 10 us;
A7, the function generator produces a complete pulse; and
A8, the variable i is assigned to i-1; if i=0, end the address configuration, otherwise, go back to step A5.

16. The addressable test chip test system of claim 15, wherein the system is configured to, based on the function of the address register, keep the shift enable signal SE=1, the addressable test chip test system executes sequential test mode as follows:
B1, configure the SMUs and the function generator;
B2, set the address range of the DUTs from StartADDR to EndADDR, the number of the DUT is N, M measurement items need to be tested for each of said DUTs, and each of a plurality of measurement items corresponds to a different voltage/current combination of the signal line ports of each of said DUTs;
B3, each of said plurality of measurement items of the M measurement items is labeled as Mi (i is an integer from 1 to M), execute steps from B5 to B11;
B4 set the address data as StarAddr;
B5, execute steps from A4 to A8, complete the address configuration for sequential test mode;
B6, set SE=0;
B7, set the function generator to produce a continuous pulse (square wave), and set a needed frequency and set the number of pulses to N;
B8, start the function generator, during each pulse time, the addressable test chip completes an address transformation, one of the test SMUs will complete a test, and a plurality of test results are stored into test SMUs momentarily;
B9, every SamplePerFetch pulses, reads the test results from one of the test SMUs, fetches and stores the data into the database;
B10, finish the test until all the N pulses are generated, and each of the plurality of test results are stored in the database and are analyzed by the online analysis engine to identify outliers; and
wherein, StartADDR, EndADDR and SamplePerFetch are integers, and EndADDR≥StartADDR.

17. The addressable test chip test system of claim 15, wherein the system is configured to, based on the function of the address register, keep the shift enable signal SE=1, the addressable test chip test system executes diagnostic test mode as follows:
C1, configure each of the SMUs and the function generator;
C2, set the address, named ADDR, of one of the DUTs to be diagnosed;
C3, set the address data as ADDR;
C4, execute steps from A4 to A8, complete the address configuration;
C5, set SE=0;
C6, adjust the voltages/currents on the test pads, and measure accordingly for diagnosis; and
C7, go back to step C3 if another DUT needs to be diagnosed.

18. The addressable test chip test system of claim 8, wherein:
when the address register is integrated in the addressable test chip, the connect relationships of the addressable test chip test system is as follows:
at least one of said SMUs is connected to the test pads through the probe card, to provide power for the test chip;
at least one of said SMUs is connected to the switch matrix module, and the switch matrix module connected to input pads SE and SI of the address register through the probe card;
at least one of said SMUs is connected to the RST pad of the address register in the test chip through the probe card;
the function generator is connected to the CLK pad of a multipurpose register through the probe card;
each of the test SMUs are connected to the test pads in the addressable test chip through the probe card, so as to provide voltage and realize data test for the test chip;
the function generator is connected to one of the test SMUs; and
the database in the test equipment is used to store the test results.

19. The addressable test chip test system of claim 8, wherein when the address register is integrated in the probe card, the connect relationships of the addressable test chip test system is as follows:

at least one of said SMUs is connected to the test pads through the probe card, to provide power for the addressable test chip;

at least one of said SMUs is connected to the switch matrix module, and the switch matrix module is connected to input pads SE and SI of the address register in the probe card;

the output of the address signal ADDR from the address register connected to the address (ADDR) pads of the addressable test chip;

at least one of said SMUs connected to the address register through the reset signal RST;

the function generator connected to the address register through the clock signal CLK;

at least two of said SMUs are test SMUs, and said test SMUs are connected to the test pads of the test chip through the probe card;

the function generator is connected to each of the test SMUs; and the database in the test equipment is used to store the test results.

20. The addressable test chip test system of claim 19, wherein the address register is integrated in the addressable test chip and constitutes a new type of addressable test chip: the input end of the address register is connected to address register pads in the test chip;

the output end of said addressing circuit(s) connected to a first port of the switching circuit, a second and a third port of the switching circuit connected to each of the plurality of DUTs and each of the plurality of test pads through signal lines;

the address register outputs the address signals ADDR, said address signals ADDR are decoded by said addressing circuit(s) as the address select signals, said address select signals control said switching circuit(s) to select one of said DUTs to be tested.

* * * * *